United States Patent
Park

(10) Patent No.: US 11,877,405 B2
(45) Date of Patent: Jan. 16, 2024

(54) ELECTRONIC DEVICE INCLUDING DISPLAY

(71) Applicant: Samsung Electronics Co., Ltd., Suwon-si (KR)

(72) Inventor: Sungeun Park, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 328 days.

(21) Appl. No.: 17/250,212

(22) PCT Filed: Jun. 4, 2019

(86) PCT No.: PCT/KR2019/006688
§ 371 (c)(1),
(2) Date: Dec. 15, 2020

(87) PCT Pub. No.: WO2019/240419
PCT Pub. Date: Dec. 19, 2019

(65) Prior Publication Data
US 2021/0274658 A1 Sep. 2, 2021

(30) Foreign Application Priority Data

Jun. 15, 2018 (KR) .................. 10-2018-0069220
Nov. 9, 2018 (KR) .................. 10-2018-0137623

(51) Int. Cl.
*C09J 7/29* (2018.01)
*H05K 5/00* (2006.01)

(52) U.S. Cl.
CPC .............. *H05K 5/0004* (2013.01); *C09J 7/29* (2018.01); *H05K 5/0017* (2013.01);
(Continued)

(58) Field of Classification Search
None
See application file for complete search history.

(56) References Cited

U.S. PATENT DOCUMENTS

| | | |
|---|---|---|
| 5,205,460 A | 4/1993 | Sato et al. |
| 5,540,807 A | 7/1996 | Akiike et al. |
| (Continued) | | |

FOREIGN PATENT DOCUMENTS

| | | |
|---|---|---|
| JP | 2005-037183 A | 2/2005 |
| JP | 4382306 B2 | 12/2009 |
| (Continued) | | |

OTHER PUBLICATIONS

International Search Report and Written Opinion of the International Searching Authority in connection with International Application No. PCT/KR2019/006688 dated Sep. 17, 2019, 12 pages.

(Continued)

*Primary Examiner* — Xanthia C Relford

(57) ABSTRACT

According to various embodiments of the present invention, an electronic device can comprise: a case comprising a first plate oriented in the first direction, a second plate oriented in the second direction opposite to the first direction, and a side member surrounding at least a part of the space between the first and second plates; a display which comprises a window and which is disposed on the first plate of the case; an adhesive material for bonding the display to the case; a first loading surface of the case on which at least a part of the display is loaded; a second loading surface of the case to which the window is attached; at least one marking part formed on the first loading surface; and at least one escape groove formed on the second loading surface. Other additional embodiments are possible.

14 Claims, 50 Drawing Sheets

(52) U.S. Cl.
CPC ...... *C09J 2203/326* (2013.01); *C09J 2301/16* (2020.08); *C09J 2400/163* (2013.01); *C09J 2400/226* (2013.01); *H05K 5/0086* (2013.01)

(56) References Cited

U.S. PATENT DOCUMENTS

| | | | |
|---|---|---|---|
| 9,473,604 | B2 | 10/2016 | Choi et al. |
| 9,616,625 | B2* | 4/2017 | Allore ............... B29C 45/14311 |
| 9,634,708 | B2* | 4/2017 | Miyazaki ................. H05K 5/06 |
| 9,696,759 | B2* | 7/2017 | Huang .................. G06F 1/1637 |
| 10,162,343 | B2* | 12/2018 | Leggett ................. G06F 1/1613 |
| 10,209,736 | B2 | 2/2019 | Kim et al. |
| 10,734,705 | B2 | 8/2020 | Choi et al. |
| 2006/0005922 | A1 | 1/2006 | Watanabe |
| 2013/0293804 | A1 | 11/2013 | Kim |
| 2014/0240911 | A1* | 8/2014 | Cole ........................ H05K 5/03 361/679.3 |
| 2015/0346782 | A1* | 12/2015 | Bushnell ................ H05K 13/00 361/679.02 |
| 2016/0147260 | A1* | 5/2016 | Huang ................ H04M 1/0266 361/679.3 |
| 2019/0027807 | A1 | 1/2019 | Choi et al. |

FOREIGN PATENT DOCUMENTS

| | | |
|---|---|---|
| JP | 2014-67916 A | 4/2014 |
| KR | 10-1992-0022438 A | 12/1992 |
| KR | 10-1995-0015684 A | 6/1995 |
| KR | 10-2000-0065864 A | 11/2000 |
| KR | 10-2005-0118221 A | 12/2005 |
| KR | 10-2014-0092669 A | 7/2014 |
| KR | 10-1649300 B1 | 8/2016 |
| KR | 10-2016-0105049 A | 9/2016 |
| KR | 10-2017-0087748 A | 7/2017 |
| KR | 10-1799491 B1 | 11/2017 |
| WO | 2017126863 A1 | 7/2017 |

OTHER PUBLICATIONS

Notice of Preliminary Rejection dated Feb. 20, 2023, in connection with Korean Application No. 10-2018-0137623, 14 pages.
Notice of Patent Grant dated Oct. 4, 2023, in connection with Korean Patent Application No. 10-2018-0137623, 5 pages.

* cited by examiner

ELECTRONIC DEVICE INCLUDING DISPLAY

CROSS-REFERENCE TO RELATED APPLICATIONS

This application is a 371 National Stage of International Application No. PCT/KR2019/006688, filed Jun. 4, 2019, which claims priority to Korean Patent Application No. 10-2018-0069220, filed, Jun. 15, 2018, and Korean Patent Application No. 10-2018-0137623, filed Nov. 9, 2018, the disclosures of which are herein incorporated by reference in their entirety.

BACKGROUND

1. Field

Various embodiments of the disclosure relate to an electronic device including a display.

2. Description of Related Art

In an assembly process, when a housing and a display are bonded to each other, an adhesive member such as tape may be used, or an adhesive solution (e.g., glue) may be used in consideration of the design of the electronic device.

In order to bond a display to a housing using an adhesive solution during the process of assembling an electronic device, a dispensing device for applying the adhesive solution, a carrier jig, or the like may be used. A housing, such as the front case, may be placed on the carrier jig, the adhesive solution may be applied using the dispensing device, and the display may then be bonded to the housing.

SUMMARY

Due to the accumulated manufacturing tolerance of the front case of a housing of an electronic device, an adhesive solution application position, to which an adhesive solution is applied using a dispensing device, may not match a reference application position.

For example, when an adhesive solution applied to a front case is applied to a position that is biased toward one side, the applied adhesive solution may overflow and come out of the window, resulting in a poor appearance, or the applied adhesive solution may flow into the housing, adversely affecting the components mounted inside the housing.

In addition, when the adhesive solution applied to the housing overflows during the process of coupling the housing to the display and flows to the outside or inside of the housing due to the pressure applied so as to couple the housing to the display, insufficient adhesive solution between the housing and the display causes poor bonding quality, and it may be impossible to provide a waterproof structure.

Various embodiments of the disclosure are able to provide an electronic device having a structure in which an adhesive solution is applied when a front case and a display are bonded to each other in an electronic device assembly process.

Solution to Problem

According to various embodiments of the disclosure, an electronic device may include: a case including a first plate oriented in a first direction, a second plate oriented in a second direction that is opposite the first direction, and a side member that surrounds at least a portion of a space between the first plate and the second plate; a display including a window and disposed on the first plate of the case; an adhesive material that allows the display to be bonded to the case; a first seating surface of the case on which at least a portion of the display is seated; a second seating surface of the case, to which the window is attached; at least one marking portion disposed on the first seating surface; and at least one escape groove defined in the second seating surface.

According to various embodiments of the disclosure, in a process of assembling an electronic device, when coupling a display to a front case, an adhesive material of the dispensing device is applied to a reference application position of the front case. Thus, it is possible to provide a waterproof structure while preventing deterioration of the appearance of the electronic device.

In addition, according to various embodiments of the disclosure, even if the adhesive material is applied to the areas of the left and right edges of an electronic device, which are relatively narrower in width than the upper and lower edges of the electronic device, it is possible to reduce eccentric application of the adhesive material using a dispensing device.

DETAILED DESCRIPTION

Figure 1:
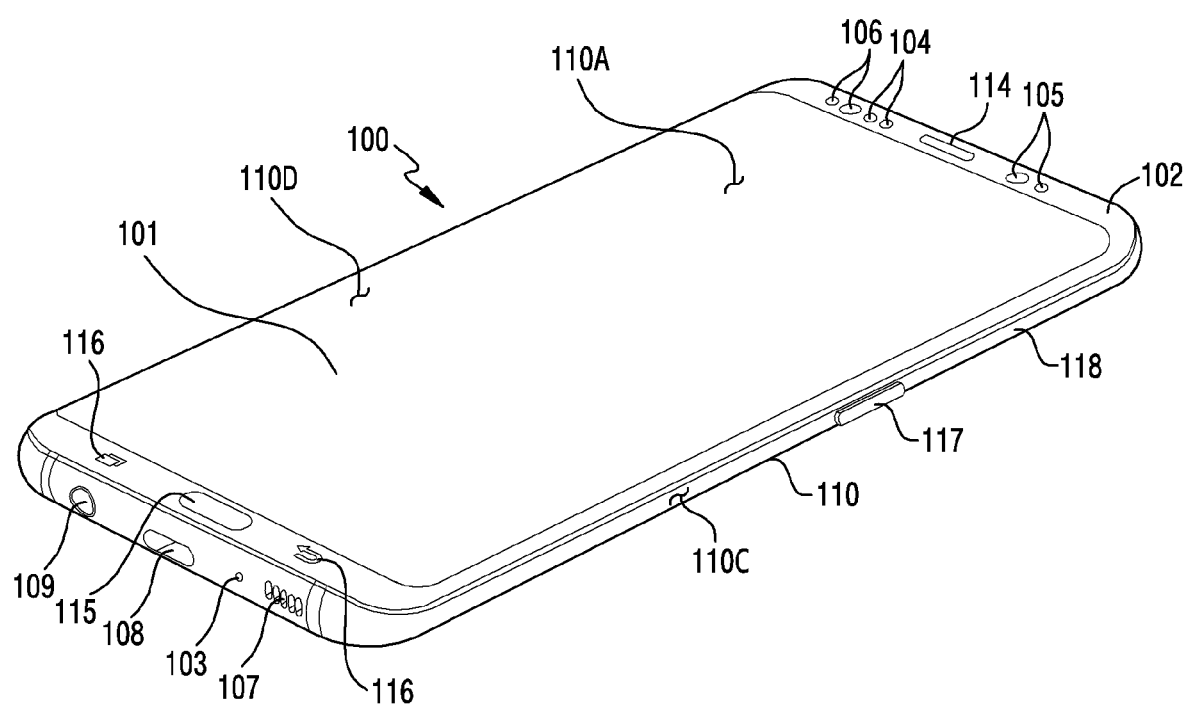
FIG. 1 is a perspective view illustrating the front side of a mobile electronic device according to an embodiment.

Hereinafter, various embodiments of the disclosure will be described with reference to the accompanying drawings.

However, it should be appreciated that these are not intended to limit the disclosure to particular embodiments and the disclosure includes various changes, equivalents, and/or alternatives for the embodiments of the disclosure. With regard to the description of the drawings, similar reference numerals may be used to designate similar or relevant elements.

An electronic device according to various embodiments of the disclosure may, for example, include at least one of a smart phone, a tablet personal computer (PC), a mobile phone, a video phone, an electronic book reader (e-book reader), a desktop PC, a laptop PC, a netbook computer, a workstation, a server, a personal digital assistant (PDA), a portable multimedia player (PMP), a MPEG-1 audio layer-3 (MP3) player, a mobile medical device, a camera, and a wearable device (e.g., smart glasses, head-mounted device (HMD)), electronic clothing, electronic bracelet, electronic necklace, electronic accessory (appcessory), electronic tattoo, smart mirror, or smart watch).

According to some embodiments, the electronic device may be a smart home appliance. The smart home appliance may, for example, include at least one of a television, a digital video disk (DVD) player, an audio, a refrigerator, an air conditioner, a vacuum cleaner, an oven, a microwave oven, a washing machine, an air purifier, a set-top box, a home automation control panel, a security control panel, a TV box (e.g., Samsung HomeSync™, Apple TV™, or Google TV™), a game console (e.g., Xbox™ and PlayStation™), an electronic dictionary, an electronic key, a camcorder, and an electronic photo frame.

According to other embodiments, the electronic device may include at least one of various medical devices (e.g., various portable medical measuring devices (blood glucose monitoring device, heart rate monitoring device, blood pressure measuring device, body temperature measuring device, etc.), magnetic resonance angiography (MRA), magnetic resonance imaging (MRI), computed tomography (CT) machine, ultrasonic machine, etc.), a navigation device, a global positioning system (GPS) receiver, an event data recorder (EDR), a flight data recorder (FDR), a vehicle infotainment device, electronic equipment for a ship (e.g., ship navigation device, gyro-compass, etc.), avionics, a security device, an automobile head unit, a home or industrial robot, an automatic teller's machine (ATM) in banks, point of sales (POS) in a shop, or Internet of things devices (e.g., light bulb, various sensors, electric or gas meter, sprinkler device, fire alarm, thermostat, streetlamp, toaster, sporting goods, hot water tank, heater, boiler, etc.).

According to some embodiments, the electronic device may include at least one of a part of furniture or a building/structure, an electronic board, an electronic signature receiving device, a projector, and various kinds of measuring instruments (e.g., water meter, electric meter, gas meter, radio wave meter, etc.). In various embodiments, the electronic device may be a combination of one or more of the aforementioned various devices. According to some embodiments, the electronic device may also be a flexible device. Further, the electronic device according to an embodiment of the disclosure is not limited to the aforementioned devices, and may include a new electronic device according to the development of technology.

Figure 2:
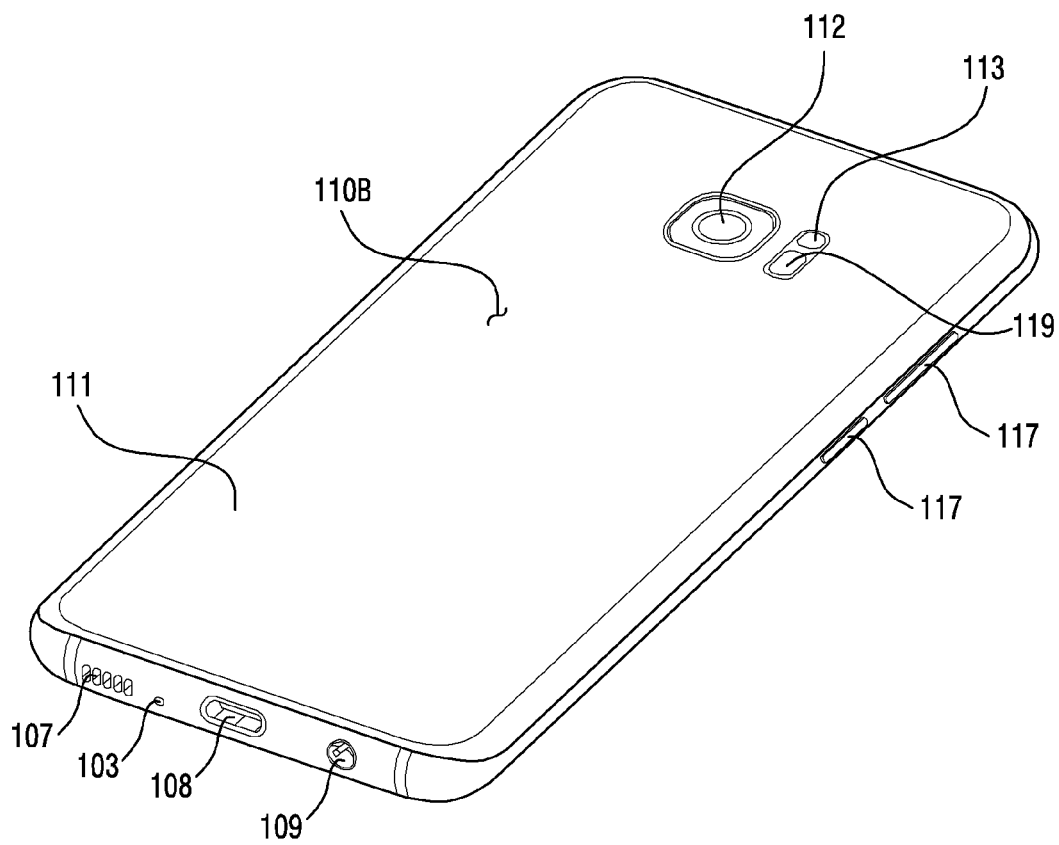
FIG. 2 is a perspective view illustrating the rear side of the electronic device of FIG. 1, according to various embodiments.

FIG. 1 is a perspective view illustrating the front face of a mobile electronic device according to an embodiment. FIG. 2 is a perspective view illustrating the rear side of the electronic device of FIG. 1, according to an embodiment.

Referring to FIGS. 1 and 2, an electronic device 100 according to an embodiment may include a housing 110 including a first surface (or a front surface) 110A, a second surface (or a rear surface) 110B, and a side surface 110C surrounding the space between the first surface 110A and the second surface 110B. In another embodiment (not illustrated), the term "housing" may refer to a structure forming some of the first surface 110A, the second surface 110B, and the side surface 110C of FIG. 1. According to an embodiment, at least a portion of the first surface 110A may be defined by a substantially transparent front plate 102 (e.g., a glass plate or a polymer plate including various coating layers). The second surface 110B may be defined by a substantially opaque rear plate 111. The rear plate 111 may be made of, for example, coated or colored glass, ceramic, a polymer, a metal (e.g., aluminum, stainless steel (STS), or magnesium), or a combination of two or more of these materials. The side surface 110C may be defined by a side bezel structure 118 (or a "side member") coupled to the front plate 102 and the rear plate 111 and including a metal and/or a polymer. In some embodiments, the rear plate 111 and the side bezel structure 118 may be integrally formed, and may include the same material (e.g., a metal material such as aluminum).

In the illustrated embodiment, the front plate 102 may include two first areas 110D, which are bent from the first surface 110A toward the rear plate 111 and extend seamlessly, at the long opposite side edges thereof. In the illustrated embodiment (see FIG. 2), the rear plate 111 may include two second areas 110E, which are bent from the second surface 110B toward the front plate 102 and extend seamlessly, at the long opposite side edges thereof. In some embodiments, the front plate 102 (or the rear plate 111) may include only one of the first areas 110D (or the second areas 110E). In another embodiment, some of the first areas 110D and the second areas 110E may not be included. In the embodiments described above, when viewed from the side of the electronic device 100, the side bezel structure 118 may have a first thickness (or width) on the side surface portions that do not include the first areas 110D or the second areas 110E, and may have a second thickness (or width), which is smaller than the first thickness, on the side surface portions that include the first areas 110D or the second areas 110E.

According to an embodiment, the electronic device 100 may include one or more of a display 101, audio modules 103, 107, and 114, sensor modules 104 and 119, camera modules 105, 112, and 113, key input devices 115, 116, and 117, an indicator 106, and connector holes 108 and 109. In some embodiments, in the electronic device 100, at least one of the components (e.g., the key input devices 115, 116, and 117 or the indicator 106) may be omitted, or other components may be additionally included.

The display 101 may be exposed through, for example, a considerable portion of the front plate 102. In some embodiments, at least a portion of the display 101 may be exposed through the front plate 102 defining the first surface 110A and the first areas 110D of the side surface 110C. The display 101 may be coupled to or disposed adjacent to a touch-sensing circuit, a pressure sensor capable of measuring touch intensity (pressure), and/or a digitizer configured to detect a magnetic-field-type stylus pen. In some embodiments, at least some of the sensor modules 104 and 119 and/or at least some of the key input devices 115, 116, and 117 may be disposed in the first areas 110D and/or the second areas 110E.

The audio modules 103, 107, and 114 may include a microphone hole 103 and speaker holes 107 and 114. The microphone hole 103 may include a microphone disposed therein so as to acquire external sound, and in some embodiments, multiple microphones may be disposed therein so as to enable detection of the direction of sound. The speaker holes 107 and 114 may include an external speaker hole 107 and a phone call receiver hole 114. In some embodiments, the speaker holes 107 and 114 and the microphone hole 103 may be implemented as a single hole, or a speaker may be included therein without the speaker holes 107 and 114 (e.g., a piezo speaker).

The sensor modules 104 and 119 may generate electrical signals or data values corresponding to the internal operating states or the external environmental states of the electronic device 100. The sensor modules 104 and 119 may include, for example, a first sensor module 104 (e.g., a proximity sensor) and/or a second sensor module (not illustrated) (e.g., a fingerprint sensor) disposed on the first surface 110A of the housing 110, and/or a third sensor module 119 (e.g., an HRM sensor) disposed on the second surface 110B of the housing 110. The fingerprint sensor may be disposed not only on the first surface 110A of the housing 110 (e.g., the home button 115), but also on the second surface 110B thereof. The electronic device 100 may further include at least one of sensor modules (not illustrated), such as a gesture sensor, a gyro sensor, an atmospheric pressure sensor, a magnetic sensor, an acceleration sensor, a grip sensor, a color sensor, an infrared (IR) sensor, a biometric sensor, a temperature sensor, a humidity sensor, or an illuminance sensor 104.

The camera modules 105, 112, and 113 may include a first camera device 105 disposed on the first surface 110A of the electronic device 100 and a second camera device 112 disposed on the second surface 110B thereof, and/or a flash 113. The camera devices 105 and 112 may include one or more lenses, an image sensor, and/or an image signal processor. The flash 113 may include, for example, a light-emitting diode or a xenon lamp. In some embodiments, two or more lenses (e.g., an infrared camera lens, a wide-angle lens, and a telephoto lens) and image sensors may be disposed on one face of the electronic device 100.

The key input devices 115, 116, and 117 may include a home key button 115 disposed on the first surface 110A of the housing 110, a touch pad 116 disposed in the vicinity of the home key button 115, and/or a side key button 117 disposed on the side surface 110c of the housing 110. In another embodiment, the electronic device 100 may not include some or all of the above-mentioned key input devices 115, 116, and 117, and a non-included key input device 115, 116, or 117 may be implemented in another form, such as a soft key on the display 101.

The indicator 106 may be disposed on, for example, the first surface 110A of the housing 110. The indicator 106 may provide, for example, state information of the electronic device 100 in an optical form, and may include an LED.

The connector holes 108 and 109 may include a first connector hole 108, which is capable of accommodating a connector (e.g., a USB connector) for transmitting and receiving power and/or data to and from an external electronic device, and/or a second connector hole 109, which is capable of receiving a connector (e.g., an earphone jack) for transmitting and receiving an audio signal to and from an external electronic device.

Figure 3:
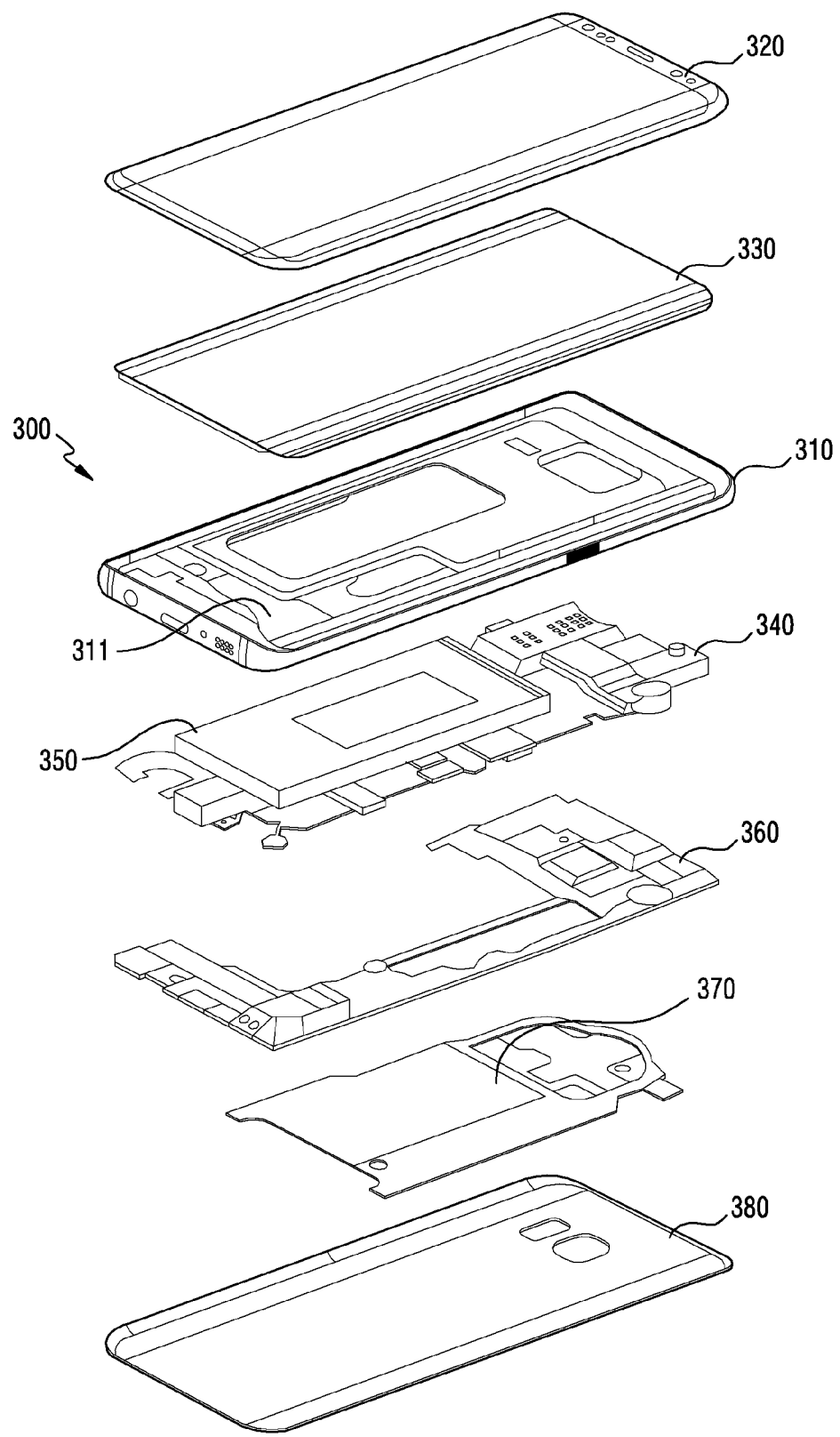
FIG. 3 is an exploded perspective view illustrating the internal configuration of the electronic device of FIG. 1 according to various embodiments.

FIG. 3 is an exploded perspective view illustrating the internal configuration of the electronic device of FIG. 1, according to various embodiments.

Referring to FIG. 3, an electronic device 300 may include a side bezel structure 310, a first support member 311 (e.g., a bracket), a front plate 320, a display 330, a printed circuit board 340, a battery 350, a second support member 360 (e.g., a rear case), an antenna 370, and a rear plate 380. In some embodiments, at least one of the components (e.g., the first support member 311 or the second support member 360) may be omitted from the electronic device 300, or other components may be additionally included in the electronic device 300. At least one of the components of the electronic device 300 may be the same as or similar to at least one of the components of the electronic device 100 of FIG. 1 or 2, and a redundant description thereof is omitted below.

The first support member 311 may be disposed inside the electronic device 300 so as to be connected to the side bezel structure 310, or may be formed integrally with the side bezel structure 310. The first support member 311 may be formed of, for example, a metal material and/or a non-metal material (e.g., a polymer). The display 330 may be coupled to one surface of the first support member 311, and the printed circuit board 340 may be coupled to the other surface of the first support member 311. On the printed circuit board 340, a processor, a memory, and/or an interface may be mounted. The processor may include at least one of, for example, a central processing unit, an application processor, a graphics processor, an image signal processor, a sensor hub processor, or a communication processor.

The memory may include, for example, a volatile memory or a nonvolatile memory.

The interface may include, for example, a high-definition multimedia interface (HDMI), a universal serial bus (USB) interface, an SD card interface, and/or an audio interface. The interface may electrically or physically connect, for example, the electronic device 300 to an external electronic device, and may include a USB connector, an SD card/MMC connector, or an audio connector.

The battery 350 is a device for supplying power to at least one component of the electronic device 300, and may include, for example, a non-rechargeable primary battery, a rechargeable secondary battery, or a fuel cell. At least a portion of the battery 350 may be disposed on substantially the same plane as, for example, the printed circuit board 340. The battery 350 may be integrally disposed inside the electronic device 300, or may be detachably disposed on the electronic device 300.

The antenna 370 may be disposed between the rear plate 380 and the battery 350. The antenna 370 may include, for example, a nearfield communication (NFC) antenna, a wireless charging antenna, and/or a magnetic secure transmission (MST) antenna. The antenna 370 may perform short-range communication with, for example, an external electronic device, or may transmit/receive power required for charging to/from the external device in a wireless manner. In another embodiment, an antenna structure may be formed by the side bezel structure 310, a portion of the first support member 311, or a combination thereof.

Figure 4:
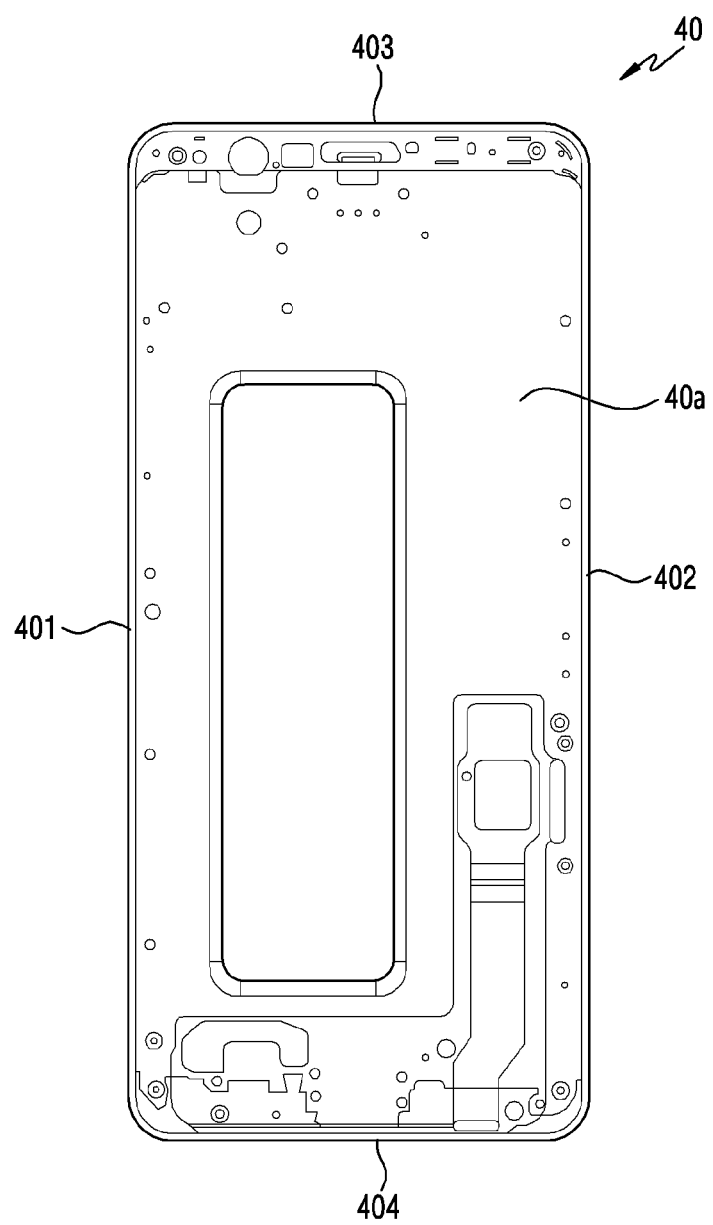
FIG. 4 is a plan view illustrating a front case according to various embodiments.

FIG. 4 is a plan view illustrating a front case according to various embodiments.

Referring to FIG. 4, a housing 40 according to various embodiments may be a support member to which a display is attached, or may be a front case.

Hereinafter, the housing 40 will be referred to as a front case. An adhesive material may be applied to the front case 40 so as to bond a display to the front case 40. A bonding structure using an adhesive material between the front case 40 and the display (e.g., a window) may provide a waterproof structure for the electronic device.

The front case 40 according to various embodiments may include a first surface 40a and a second surface (not illustrated) opposite the first surface 40a. In addition, the front case 40 may include first to fourth edges 401 to 404. For example, the first and second edges 401 and 402 may face each other, and the third and fourth edges 403 and 404 may be located between the first and second edges 401 and 402, and may face each other.

Due to the tolerance accumulated during the process of manufacturing the front case 40, an adhesive material may not be applied to an intended position on the front case 40. The adhesive material may be in a liquid state or an intermediate degree between a liquid state and a solid state when dispensed from a dispensing device, and may be in a solid state after the bonding process is completed.

Figure 5A:
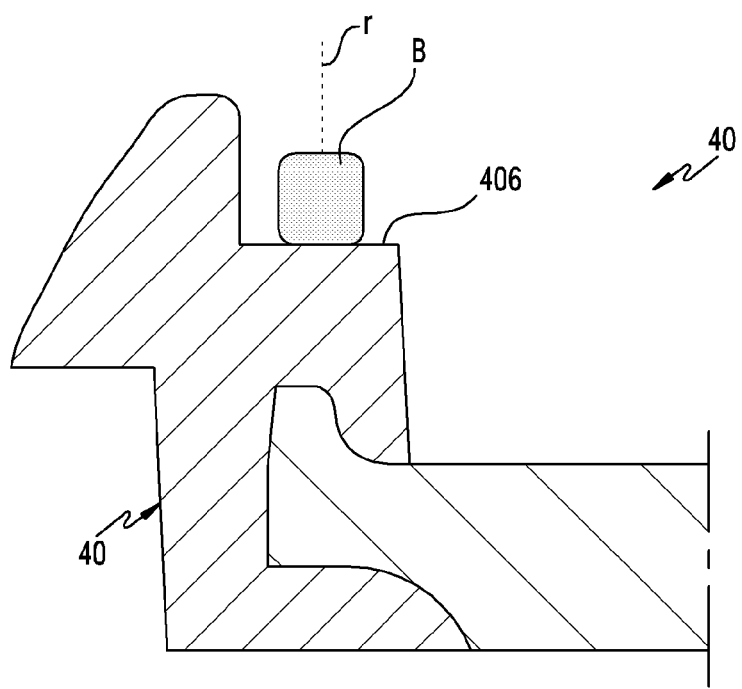
FIG. 5A is a cross-sectional view illustrating the state in which an adhesive material is applied to a reference application position on a second seating surface of the front case according to various embodiments.
Figure 5B:
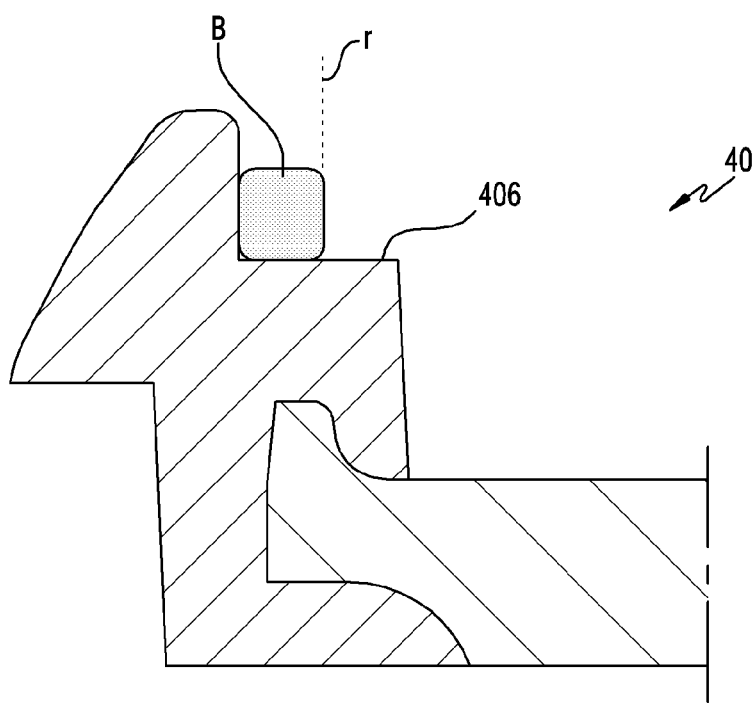
FIG. 5B is a cross-sectional view illustrating the state in which an adhesive material is applied to an application position biased to the left on the second seating surface of the front case according to various embodiments.
Figure 5C:
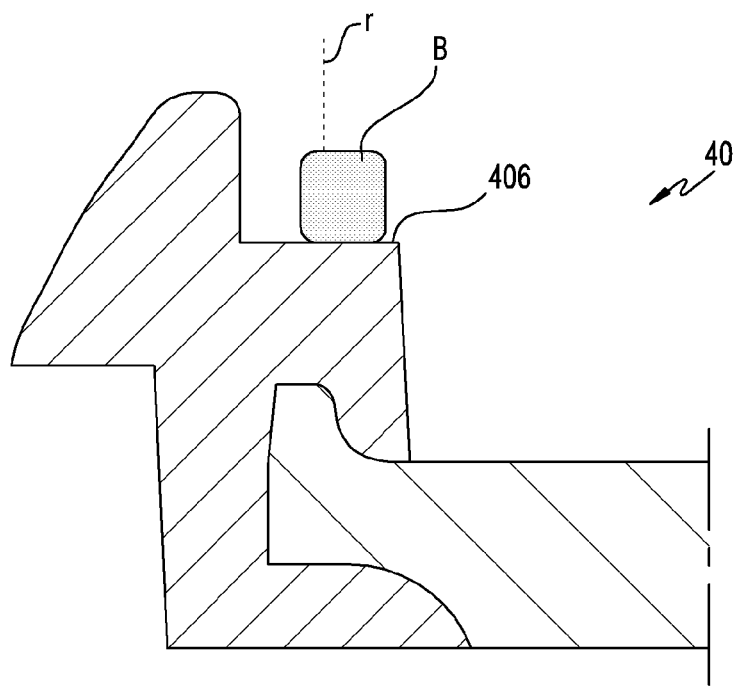
FIG. 5C is a cross-sectional view illustrating the state in which an adhesive material is applied to an application position biased to the right on the second seating surface of the front case according to various embodiments.

FIG. 5A is a cross-sectional view illustrating the state in which an adhesive material is applied to a reference application position on a second seating surface of the front case according to various embodiments. FIG. 5B is a cross-sectional view illustrating the state in which an adhesive material is applied to an application position biased to the left on the second seating surface of the front case according to various embodiments. FIG. 5C is a cross-sectional view illustrating the state in which an adhesive material is applied to an application position biased to the right on the second seating surface of the front case according to various embodiments.

For example, with reference to a normal state of application to a reference application position r on the seating surface 406 of the front case 40, as illustrated in FIG. 5A, the adhesive material B may be applied to the seating surface 406 of the front case 40 in the state of being biased to the left, as illustrated in FIG. 5B, or the adhesive material may be applied to the seating surface 406 of the front case 40 in the state of being biased to the right, as illustrated in FIG. 5C.

Among the above-mentioned adhesive material application states, the front case 40 may be bonded to the display with reference to the normal application state (the state illustrated in FIG. 5A).

Figure 6A:
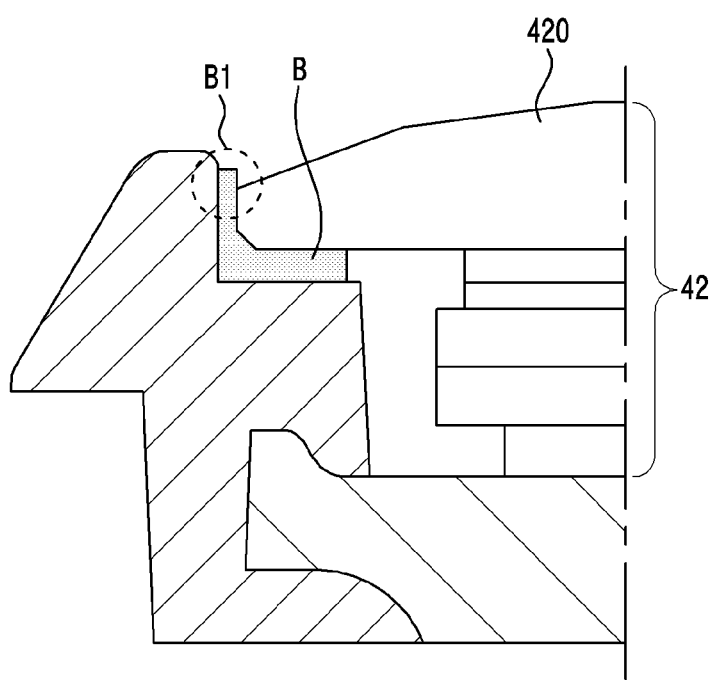
FIG. 6A is a cross-sectional view illustrating the state in which an adhesive material is applied to an application position biased to the left on the second seating surface of the front case according to various embodiments, and thus some of the applied adhesive material overflows to the outside of a window.
Figure 6B:
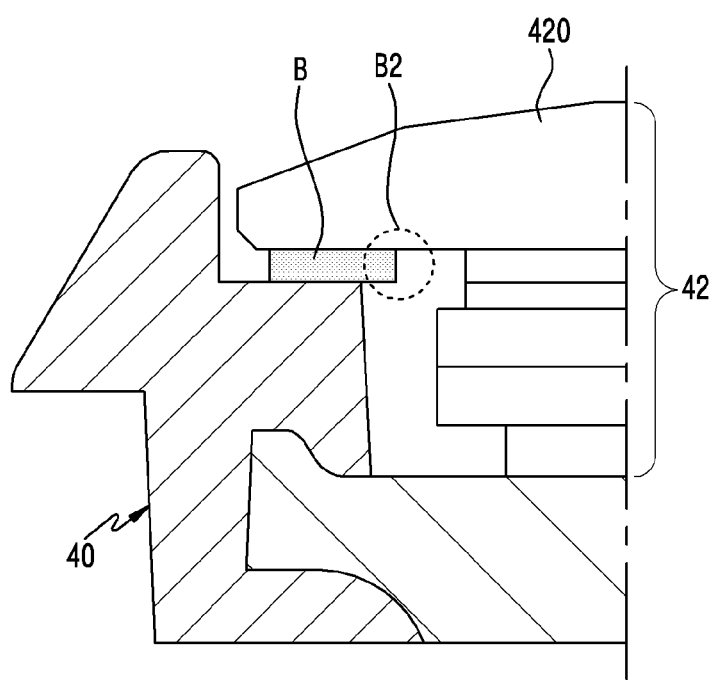
FIG. 6B is a cross-sectional view illustrating the state in which an adhesive material is applied to an application position biased to the right on the second seating surface of the front case according to various embodiments, and thus some of the applied adhesive material overflows to the inside of a window.

FIG. 6A is a cross-sectional view illustrating the state in which an adhesive material is applied to an application position biased to the left on the second seating surface of the front case according to various embodiments, and thus some of the applied adhesive material overflows to the outside of a window. FIG. 6B is a cross-sectional view illustrating the state in which an adhesive material is applied to an application position biased to the right on the second seating surface of the front case according to various embodiments, and thus some of the applied adhesive material overflows to the inside of a window.

As illustrated in FIG. 6A, when the adhesive material B is applied to the front case 40 in the state of being biased to the left and then the window 420 of the display 42 is attached to the front case 40, some of the applied adhesive material B1 may flow upwards to thus be exposed to the exterior of the electronic device. As illustrated in FIG. 6A, when the adhesive material B is applied to the front case 40 in the state of being biased to the right and then the display 42 is attached to the case 40, some of the applied adhesive material B2 may flow to the inside of the front case 40.

According to various embodiments, after the front case 40 is placed on a carrier jig 50, the adhesive material B may be applied to the reference application position, and then the display may be coupled to the front case 40.

Figure 7A:
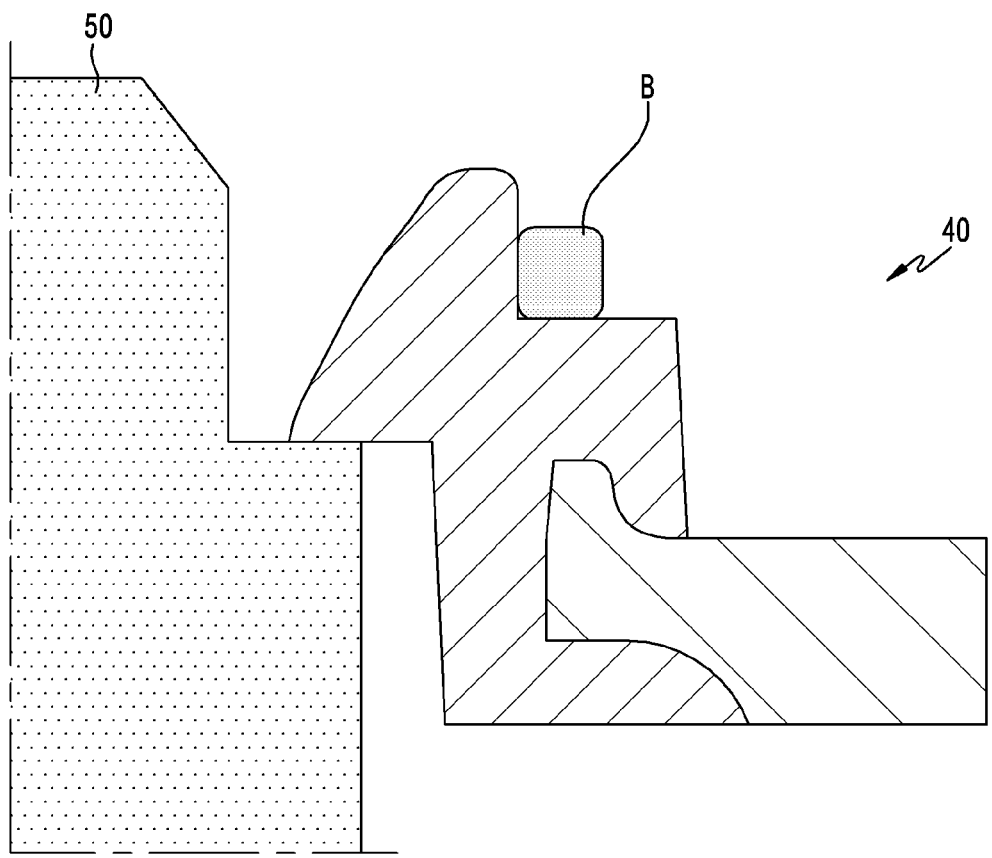
FIG. 7A is a cross-sectional view illustrating the state in which the front case according to various embodiments is disposed on a carrier jig in the state of being biased to the right, after which an adhesive material is applied on a seating portion in the state of being biased to the left.
Figure 7B:
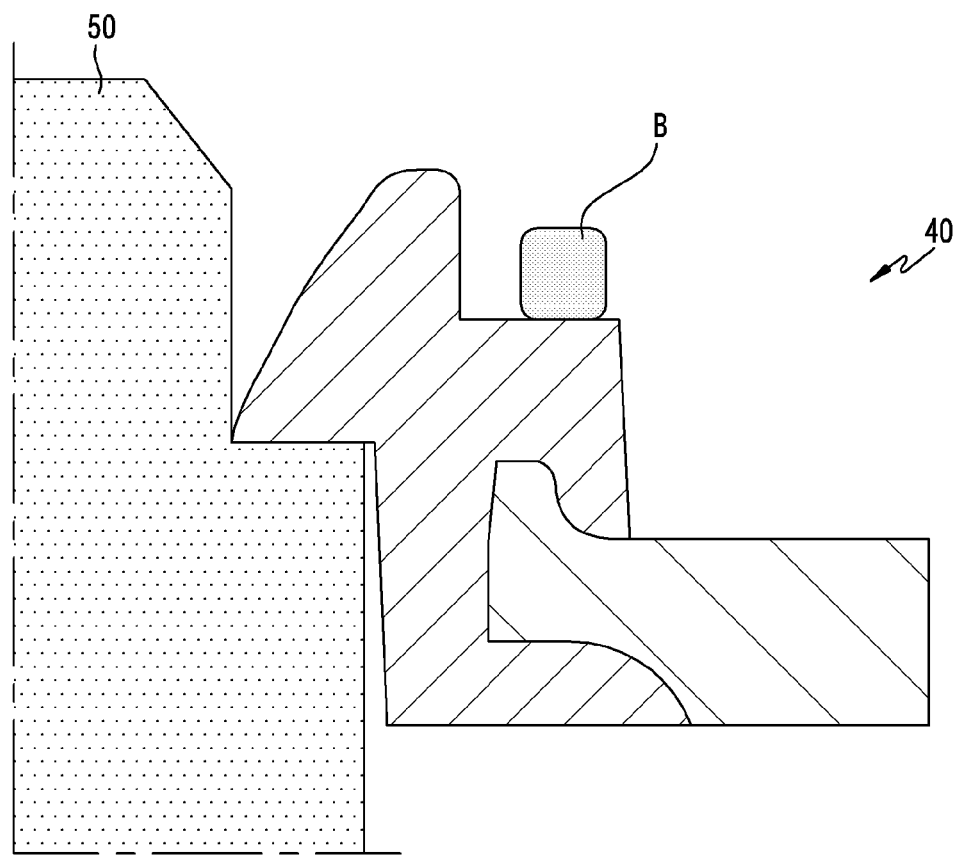
FIG. 7B is a cross-sectional view illustrating the state in which the front case according to various embodiments is disposed on a carrier jig in the state of being biased to the left, after which an adhesive material is applied on a seating portion in the state of being biased to the right.

FIG. 7A is a cross-sectional view illustrating the state in which the front case according to various embodiments is disposed on a carrier jig in the state of being biased to the right and then an adhesive material is applied on a seating portion in the state of being biased to the left. FIG. 7B is a cross-sectional view illustrating the state in which the front case according to various embodiments is disposed on a carrier jig in the state of being biased to the left and then an adhesive material is applied on a seating portion in the state of being biased to the right.

When the front case 40 is placed on the carrier jig 50 in the state of being biased to the right as illustrated in FIG. 7A, the adhesive material B may be applied to the front case in the state of being biased to the left as illustrated in FIG. 6A, and some of the applied adhesive material B1 may flow upwards to be exposed to the exterior of the electronic device, and when the front case 40 is placed on the carrier jig 50 in the state of being biased to the left as illustrated in FIG. 7B, the adhesive material B may be applied to the front case in the state of being biased to the right as illustrated in FIG. 6B, and some of the applied adhesive material B2 may flow to the inside of the front case.

Figure 8A:
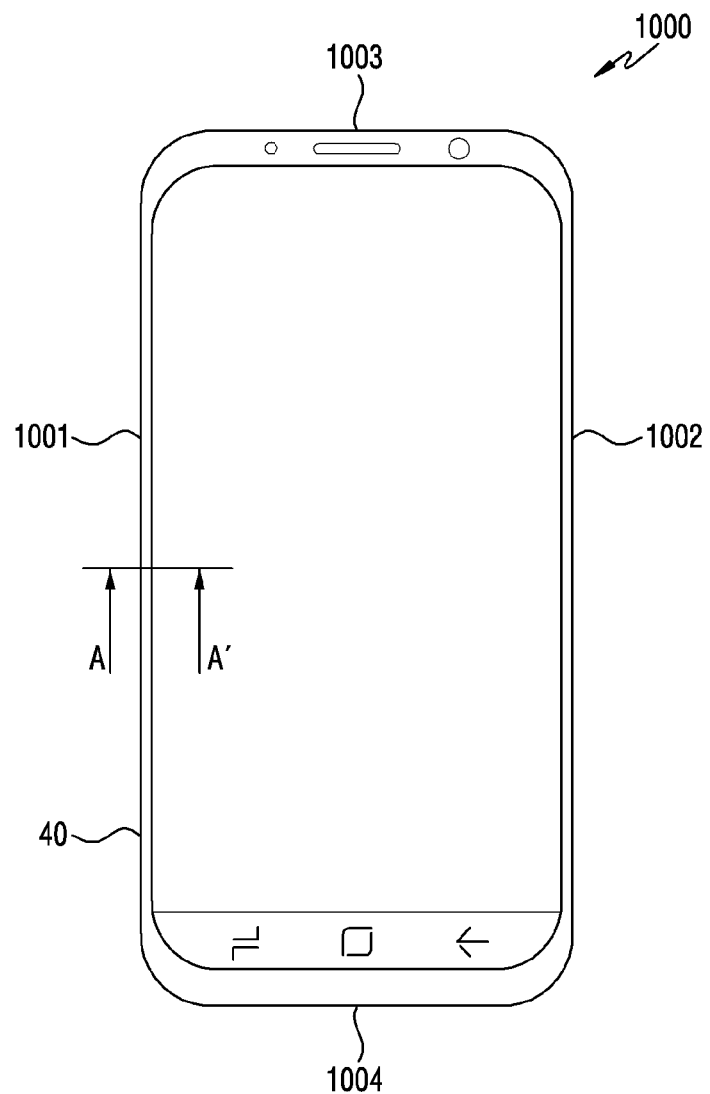
FIG. 8A is a plan view illustrating an electronic device according to various embodiments of the disclosure.
Figure 8B:
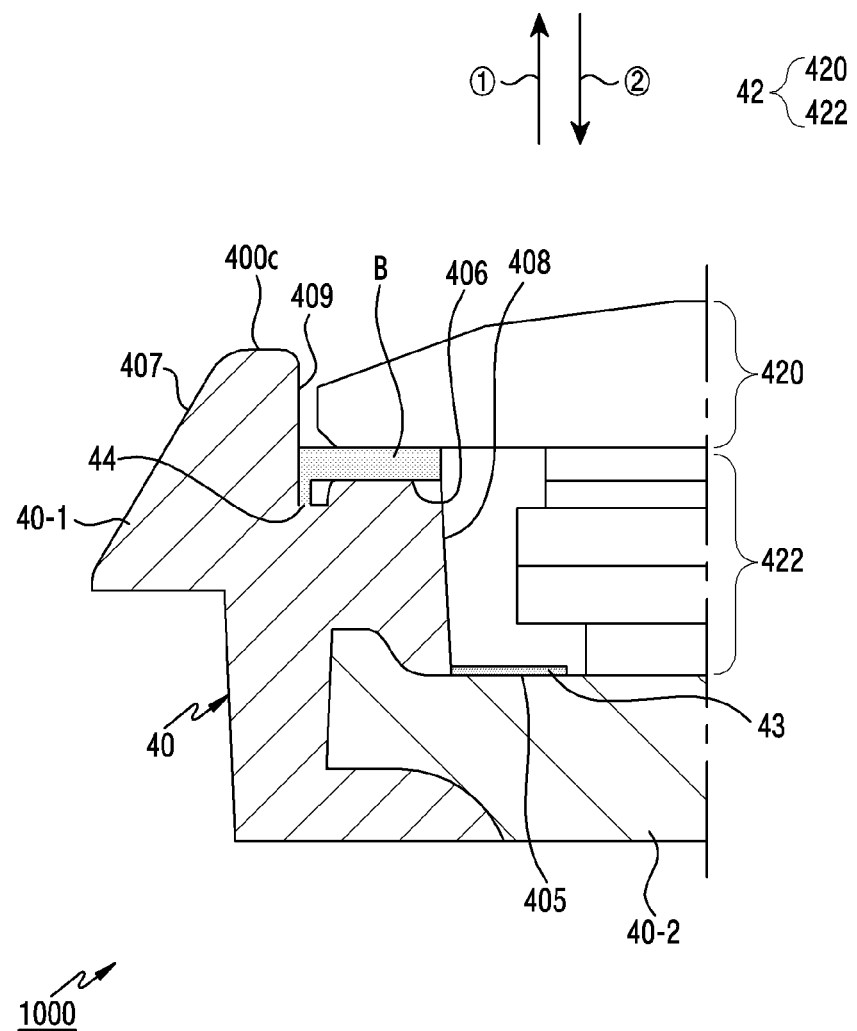
FIG. 8B is a cross-sectional view taken along line A-A' in FIG. 8A.

FIG. 8A is a plan view illustrating an electronic device according to various embodiments of the disclosure. FIG. 8B is a cross-sectional view taken along line A-A' in FIG. 8A.

Referring to FIGS. 8A and 8B, an electronic device 1000 according to various embodiments may include a front case 40 and a display 42 coupled to the front case 40. The electronic device 1000 may include first to fourth side surfaces 1001 to 1004 when viewed from above the display 42. For example, the first and second side surfaces 1001 and 1002 may face each other, and the third and fourth side surfaces 1003 and 1004 may face each other.

According to various embodiments, the electronic device 1000 may include a front case 40, a display 42, an adhesive material B, a marking part 43, and an escape groove 44.

According to various embodiments, the front case 40 may include a first material portion 40-1 and a second material portion 40-2. The first material portion 40-1 and the second material portion 40-2 may be made of different materials or may be made of the same material. For example, the first material portion 40-1 may be made of an injection-molded material (e.g., a plastic material), and the second material portion 40-2 may be made of a metal material. When the first and second material portions 40-1 and 40-2 are made of different materials, the front case 40 may be manufactured through insert injection molding or double injection molding. The marking part 43 may be disposed on the second material portion 40-2.

According to various embodiments, the front case 40 may include a first seating surface 405, a second seating surface 406, an outer surface 407, and first and second side walls 408 and 409. The first seating surface 405 may be a surface which the display panel 422 faces or on which the display 422 is seated, and the second seating surface 406 may be a portion to which the window 420 is attached and coupled, and may be an area to which the adhesive material B is applied.

According to various embodiments, the second seating surface 406 is disposed to be stepped from the first seating surface 405, and the first side wall 408 is positioned between the first and second seating surfaces 405 and 406. For example, the first sidewall 408 may be a vertical wall or an inclined wall.

According to various embodiments, the second sidewall 409 may be located between the second seating surface 406 and the upper end 400c of the front case. For example, the second sidewall 409 may include a vertical wall or an inclined wall.

According to various embodiments, at least one marking part 43 may be disposed on the first seating surface 405. The marking part 43 may be processed by, for example, a laser, and thus may be distinguished from the second seating surface 406 by a difference in color and contrast. For example, the first seating surface 405 may be a flat surface, and may be a horizontal surface.

According to various embodiments, the second seating surface 406 may be a coating surface to which the adhesive material B is applied, and may be configured as a flat surface, an inclined surface, or a curved surface. The second seating surface 406 may include at least one escape groove 44 configured to prevent a portion of the applied adhesive material B from overflowing. The escape groove 44 may have a shape recessed downwards in the area where the second side wall 409 and the second seating surface 406 meet. According to various embodiments, the escape groove 44 may be configured in a shape recessed in a second direction. For example, the escape groove 44 may continuously extend along the edge of the front case 40 in the form of a closed curve. During the process of coupling the front case 40 and the display 42 to each other, the adhesive material B applied to the second seating surface 406 is pressed by an upper plate jig, and some of the applied adhesive material B escapes to the escape groove 44. Thus, it is possible to prevent the adhesive material B from escaping to the outside of the window 420. That is, the escape groove 44 may be a portion of a coupling structure capable of preventing overflow of the applied adhesive material B.

Figure 9:
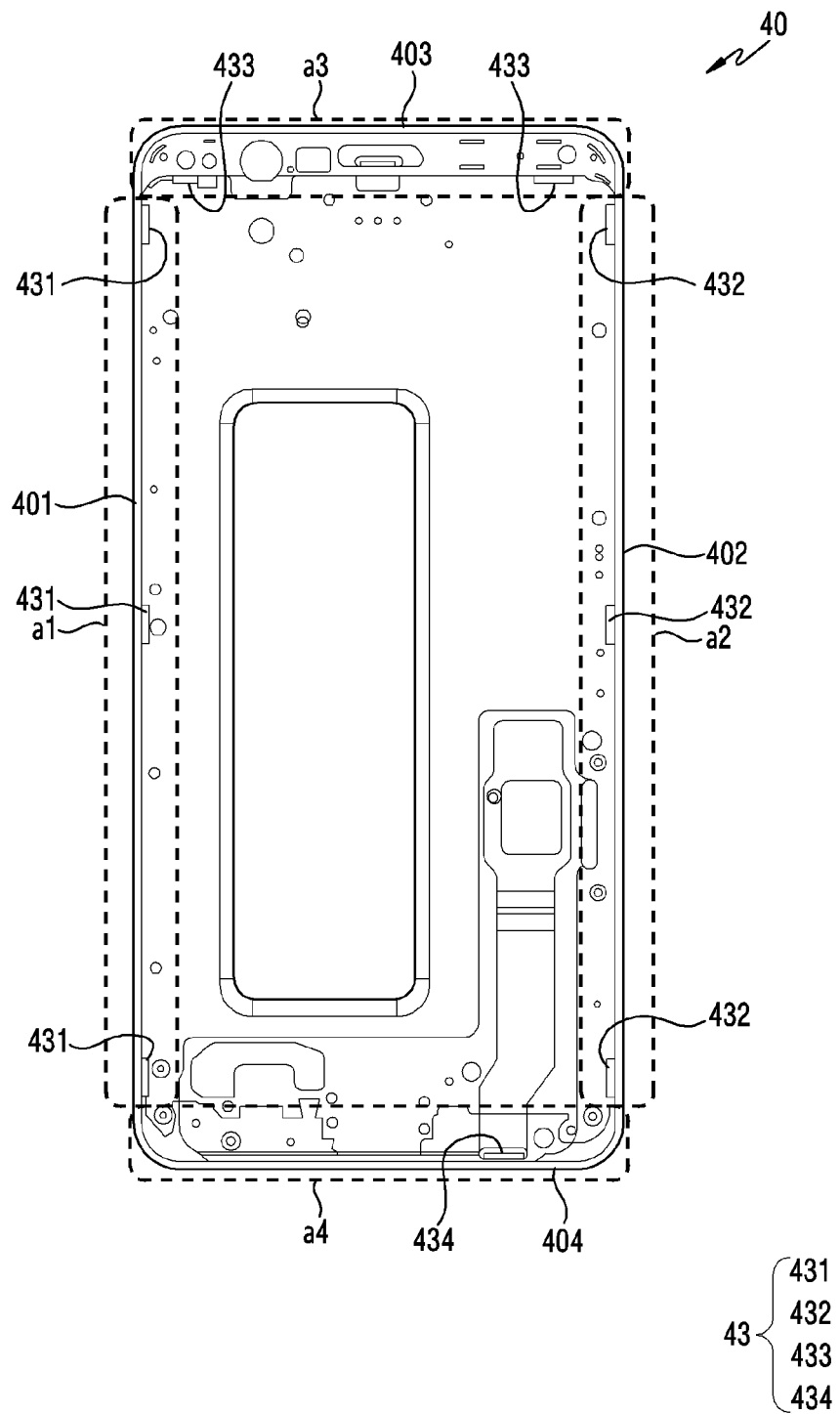
FIG. 9 is a plan view illustrating a front case according to various embodiments of the disclosure.

FIG. 9 is a plan view illustrating a front case according to various embodiments of the disclosure.

Referring to FIG. 9, when viewed from above, the front case 40 according to various embodiments may be configured in a rectangular shape, and may include first to fourth edges 401 to 404. For example, the first edge 401 may be the left edge, the second edge 402 may be the right edge facing the first edge 401, the third edge 403 may be the upper edge, and the fourth edge 404 may be a lower side facing the third edge 403.

According to various embodiments, one or more marking parts 43 may be disposed on a first edge area a1 at the first edge of the front case 40, a second edge area a2 at the second edge, a third side area a3 at the third edge, or a fourth edge area a4 at the fourth edge. In addition, the marking parts 43 may be disposed on the first and second edge areas a1 and a2 or on the third and fourth edge areas a3 and a4. Alternatively, the marking parts 43 may be disposed on three or more edge areas, or may be disposed on all of the first to fourth edge areas a1 to a4. For example, one or more marking parts 431 to 434 may be disposed on each of the first to fourth edge areas a1 to a4.

Each of the marking parts 431 to 434 may have an elongated shape or a linear shape along a corresponding one of the edges 410-404, and may be formed in a linear shape. For example, when one or more marking parts 431 are disposed on the first edge area a1, the marking parts may be respectively disposed in the upper end portion of the first edge area a1, the lower end portion of the first edge area a1, and the intermediate portion between the lower portion and the upper and lower portions. In addition, the marking parts 431 and 432 may be disposed symmetrically or asymmetrically with respect to each other in the first and second edge areas a1 and a2, and may be disposed symmetrically or asymmetrically with respect to each other in the third and fourth edge areas a3 and a4. In addition, the marking parts 431 to 434 in the first to fourth edge areas a1-a4 may have the same shape, or may have different shapes.

According to various embodiments, the marking parts 431 to 434 may be processed using a laser.

According to various embodiments, the marking parts 431 to 434 may be individually controlled by individually performing laser marking on each of adhesive material paths constituted with the first to fourth edge areas a1 to a4 and then recognizing an edge recognition point P. For example, after performing laser marking on each of the left, right, upper, and lower edges a1-a4, each edge recognition point may be recognized, and then each edge may be controlled.

Figure 10A:
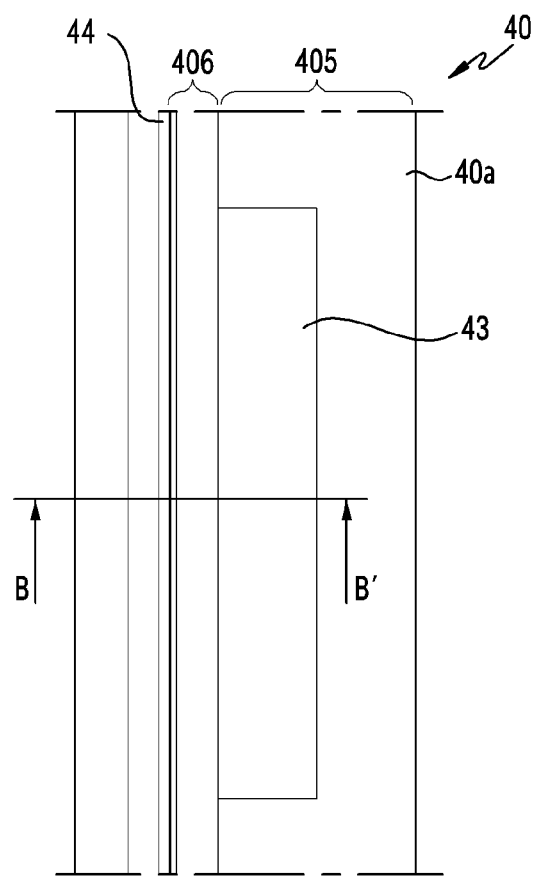
FIG. 10A is an enlarged view of a part of FIG. 9.

FIG. 10A is an enlarged view of a part of FIG. 9.

Referring to FIG. 10A, when viewed from above the top surface 40a of the front case 40 according to various embodiments, there may be a distinct difference in contrast between the marking part 43 on the first seating surface 405 of the front case and the second seating surface 406. Since the marking part 43 on the first seating surface 405 is formed by a laser, the difference in contrast between the marking part 43 and the second seating surface may be increased. For example, a roughness detectable based on surface roughness, an actual color, or the like may be applied to the marking part 43.

Figure 10B:
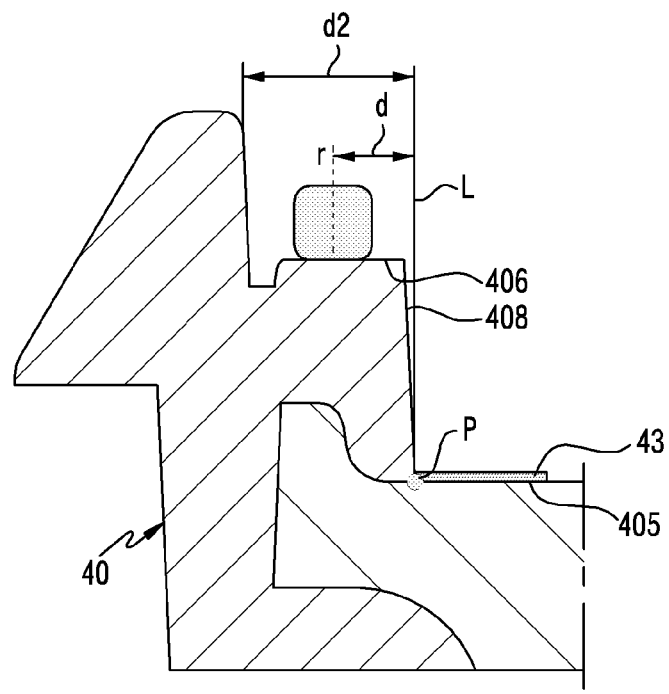
FIG. 10B is a cross-sectional view taken along line B-B' in FIG. 10A.

FIG. 10B is a cross-sectional view taken along line B-B' in FIG. 10A.

Referring to FIG. 10B, according to various embodiments, in the front case, an edge recognition point P may be detected through a scanning operation or the like. A reference application position r may be disposed on the second seating surface 406, and may be spaced apart from the edge recognition point P by a first distance d.

When the first distance d is defined as a distance between a vertical line L extending upwards from the edge recognition point P and the reference application position r and a second distance d2 is defined as a distance between the vertical line extending upwards from the edge recognition point P and the escape groove, the first distance d may be smaller than the second distance d2. An adhesive material may be applied to the reference application position r.

According to various embodiments, the front case 40 may be applied to the reference application position r existing on the second seating surface 406 and spaced apart from the edge recognition point P by the first distance d. The reference application position r may be located at a first distance d from the vertical line L extending from the edge recognition point P.

FIGS. 11A to 11D are views each illustrating an exemplary process for determining a reference application position on the second seating surface of the front case according to various embodiments of the disclosure.

Referring to FIGS. 11A to 11D, in order to dispense an adhesive material at a reference application position r on the second seating surface 406 of the front case 40, a vision camera provided in a dispensing device (not illustrated) may set a boundary line recognition area A in a first recognition operation.

Subsequently, the vision camera may perform a second recognition operation in which a scanning operation is performed in a first direction (from the dark side to the bright side) and is then performed in reverse (from the bright side to the dark side).

After the scanning operation of the vision camera, the dispensing device may detect a point where the contrast is changed, may then detect an edge recognition point P, and may recognize a boundary line according to the edge recognition point P.

Finally, the dispensing device may apply the adhesive material on the reference application position r disposed on the second seating surface 406 and spaced apart from the edge recognition point P by the predetermined first distance d.

In these recognition operations, the adhesive material application position may be determined using one or more marking parts 43 disposed on each of the four edges of the front case 40.

According to various embodiments, each marking part 43 may be formed on an insert of the front case. An insert made of a metallic material may suffer from a change in color due to foreign matter during the manufacture thereof, and such nonuniform variation in color may deteriorate accuracy in edge recognition.

Edge recognition serves to recognize the boundary line between the front case and the metal insert based on a difference in contrast, and here, the edge recognition point P may be more accurately recognized when the surface of the metal insert is more uniform. For example, the edge recognition point P may be located on the engagement portion between the injection-molded front case and the surface of the metal insert, and fine burrs may be formed at the engagement portion when the mold is continuously used. Due to these burrs, the edge recognition point may vary. In an embodiment of the disclosure, an accurate edge recognition point can be recognized by removing the fine burrs using a laser. The difference in contrast may be caused by, for example, a difference in color, illuminance, or roughness.

Figure 11A:
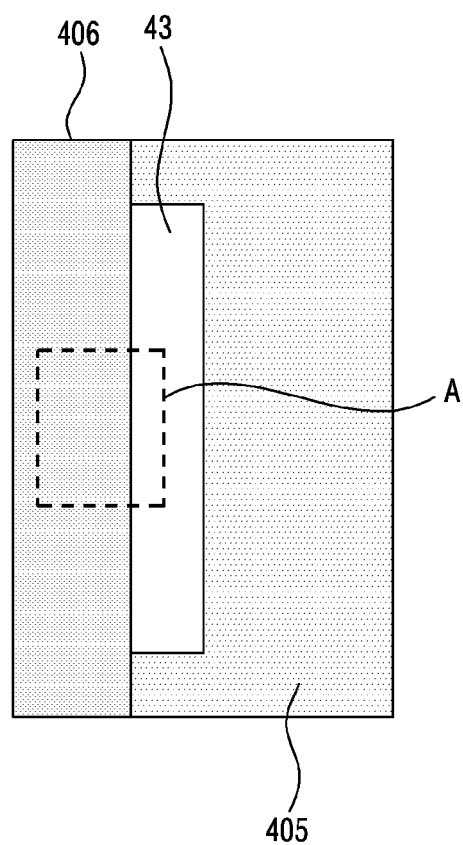
FIGS. 11A to 11D are views each illustrating an exemplary process for determining a reference application position on the second seating surface of the front case according to various embodiments of the disclosure.
Figure 11B:
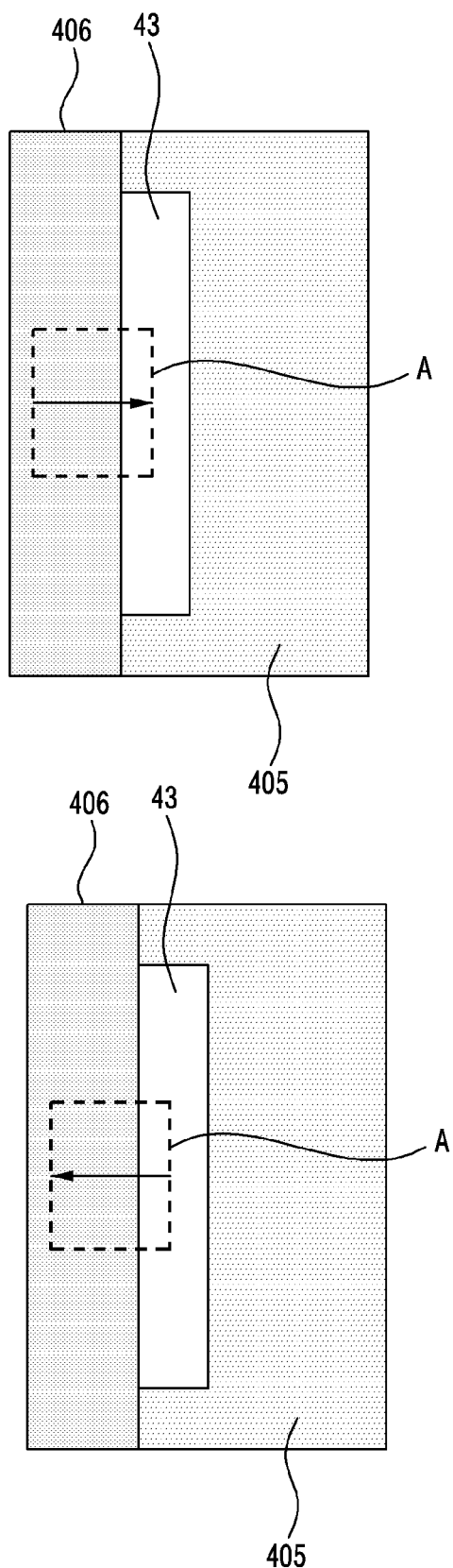
Figure 11C:
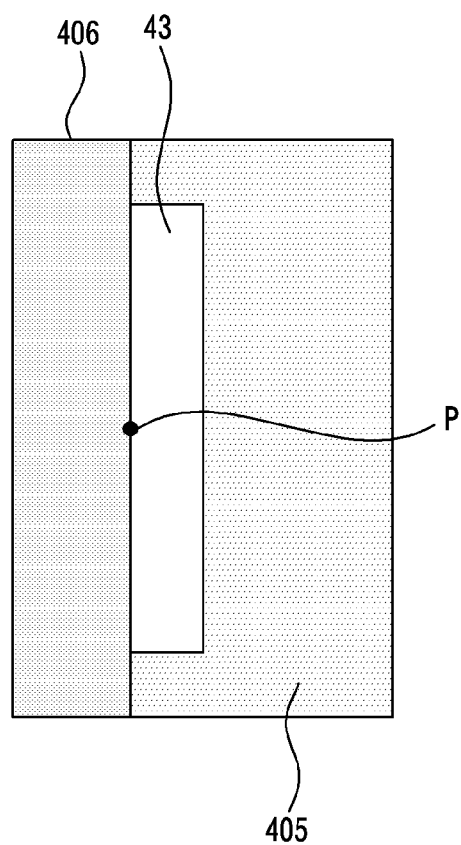
Figure 11D:
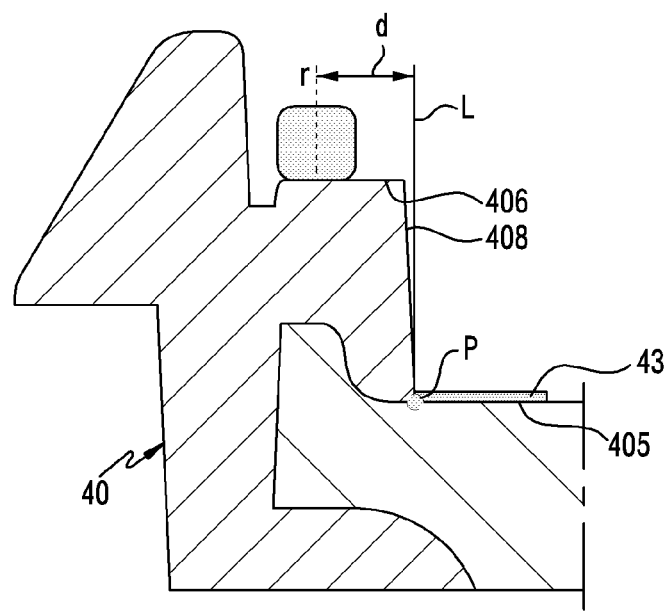
Figure 11E:
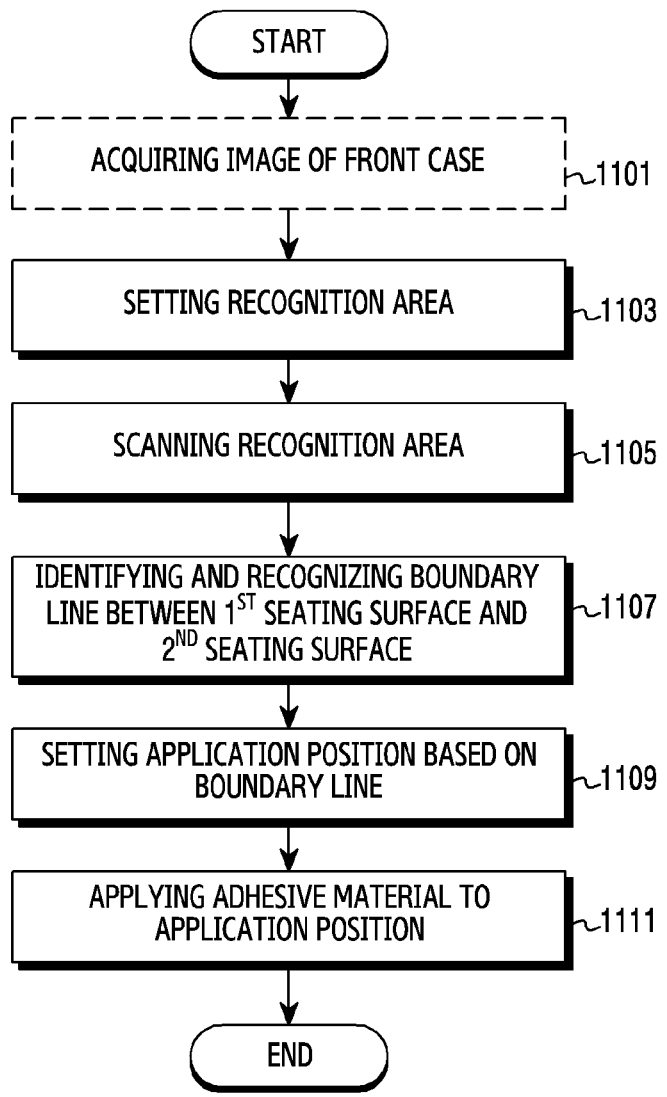
FIG. 11E is a flowchart sequentially illustrating a recognition process for determining a reference application position on the second seating surface of the front case according to various embodiments of the disclosure.

FIG. 11E is a flowchart sequentially illustrating a process for determining a reference application position on the second seating surface of the front case according to various embodiments of the disclosure.

Hereinbelow, a process of determining a reference application position of an adhesive material applied to the second seating surface of the front case will be described with reference to the flowchart of FIG. 11E. In the following description, the dispensing device may include a device for applying an adhesive material (glue).

Referring to FIG. 11E, in operation 1101, the dispensing device (not illustrated) may acquire an image of the front case (e.g., the housing of an electronic device) using an image sensor. For example, the dispensing device may periodically acquire an image of the front case. As another example, when detecting that the front case of the electronic device is disposed in a predetermined area, the dispensing device may obtain an image of the front case using the image sensor. As an example, the image sensor may include a vision camera provided in the dispensing device. This operation 1101 may be optional.

In operation 1103, the dispensing device may set a boundary line recognition area (e.g., the boundary area A in FIG. 11A) within the image of the front case. For example, the dispensing device may set a recognition area having a predetermined size with reference to the center of the image of the front case. For example, the dispensing device may set at least a portion of the image of the front case including two different colors as the recognition area A for detecting the boundary line.

In operation 1105, the dispensing device may scan the recognition area A at least one time in order to distinguish the boundary between a first seating surface (e.g., the first seating surface 405 in FIG. 11A) and a second seating surface (e.g., the second seating surface 406 in FIG. 11A). For example, the dispensing device may perform scanning in a first direction and scanning in a second direction opposite the first direction in units of lines. For example, the scanning in the first direction may include scanning from a dark side (e.g., corresponding to the second seating surface) to a bright side (e.g., corresponding to the first seating surface) in the recognition area A. The scanning in the second direction may include scanning from a light side (e.g., corresponding to the first seating surface) to a dark side (e.g., corresponding to the second seating surface) in the recognition area. For example, the second seating surface may include one surface to which an adhesive material is applied. The first seating surface 405 at the bright side may include one or more marking parts.

In operation 1107, the dispensing device may identify the boundary line between the first seating surface 405 and the marking part 43 on the second seating surface based on the result of scanning the recognition area A. For example, the dispensing device may compare a first boundary line between the dark area and the bright area, acquired within the recognition area A based on the scanning result in the first direction with a second boundary line between the dark area and the bright area acquired within the recognition area based on the scanning result in the second direction. When the first boundary line and the second boundary line are the same in the recognition area A, the dispensing device may determine the corresponding boundary line to be the boundary line between the first seating surface 405 and the marking part (e.g., the second seating surface). When the first boundary line and the second boundary line are different from each other within the recognition area, the dispensing device may set a recognition area again or may change the position of the front case.

In operation 1109, the dispensing device may set the application position of the adhesive material based on the boundary line between the first seating surface and the second seating surface (the marking part). For example, the application position of the adhesive material may be set to a position spaced apart from the boundary line by a predetermined first distance d toward the second seating direction (toward the dark portion).

In operation 1111, the dispensing device may apply an adhesive material (adhesive or glue) to the reference application position r of the adhesive material.

Figure 12A:
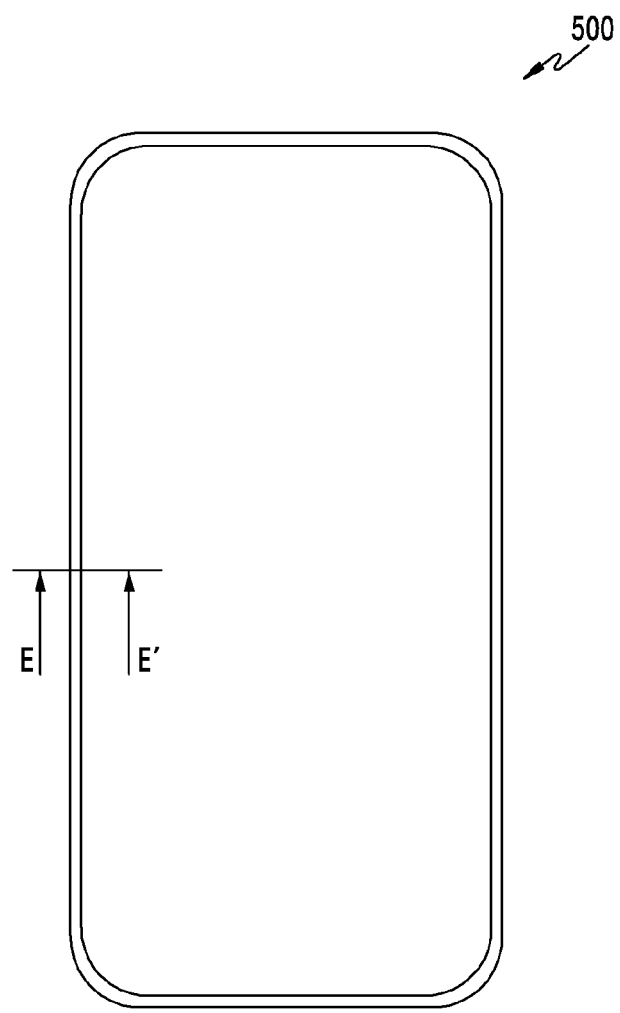
FIG. 12A is a plan view illustrating a metal front member in which an injection-molded portion is molded according to various embodiments of the disclosure.
Figure 12B:
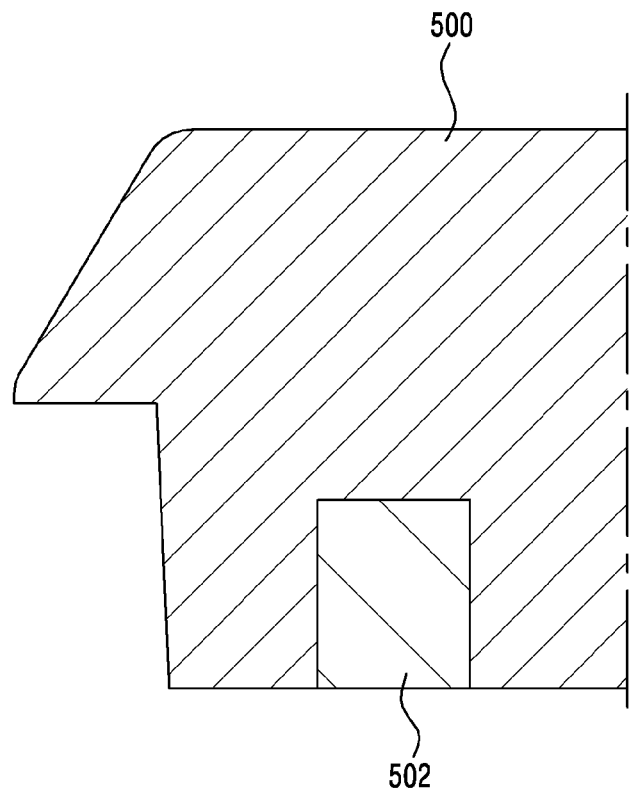
FIG. 12B is a cross-sectional view taken along line E-E' in FIG. 12A according to various embodiments.
Figure 12C:
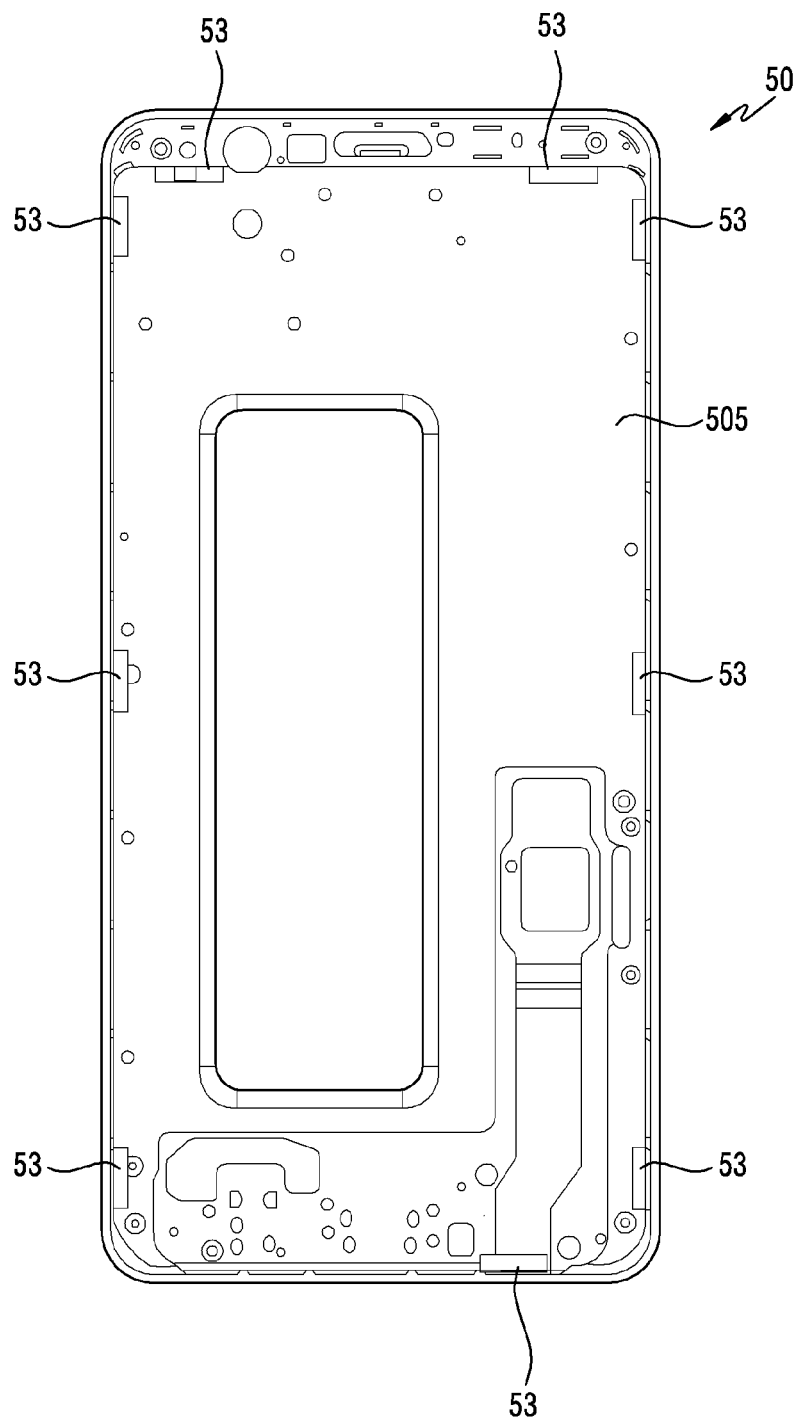
FIG. 12C is a plan view illustrating a front case manufactured through CNC machining of the metal front member of FIG. 12A according to various embodiments.

FIG. 12A is a plan view illustrating a metal front member in which an injection-molded portion is molded according to various embodiments of the disclosure. FIG. 12B is a cross-sectional view taken along line E-E' in FIG. 12A according to various embodiments. FIG. 12C is a plan view illustrating a front case manufactured through CNC machining of the metal front member of FIG. 12A according to various embodiments.

Referring to FIGS. 12A to 12C, in the front case 50 according to various embodiments, one or more injection-molded marking parts 53 may be disposed on a first seating surface through an insert-injection-molding method. One or more injection-molded marking parts 53 may be disposed on the front case 50 by manufacturing an injection-molded portion 502 in the metal front member 500 through an insert-injection-molding method and then exposing the injection-molded portion in a specific metal area through a CNC (cutting) process (e.g., pressing).

In this case, the color of the injection-molded marking parts 53 may be configured to exhibit a difference in contrast with respect to the color of the seating surface 505 of the front case 50.

The front case 50 illustrated in FIG. 12C may be manufactured through a CNC (cutting) process using the metal front 500 manufactured through the insert-injection-molding method. The one or more injection-molded marking parts 53 may be disposed around the peripheral edge of the front case 50. The positions of at least some of the injection-molded marking parts 53 may be the same as the positions of the marking parts illustrated in FIG. 9.

Figure 13A:
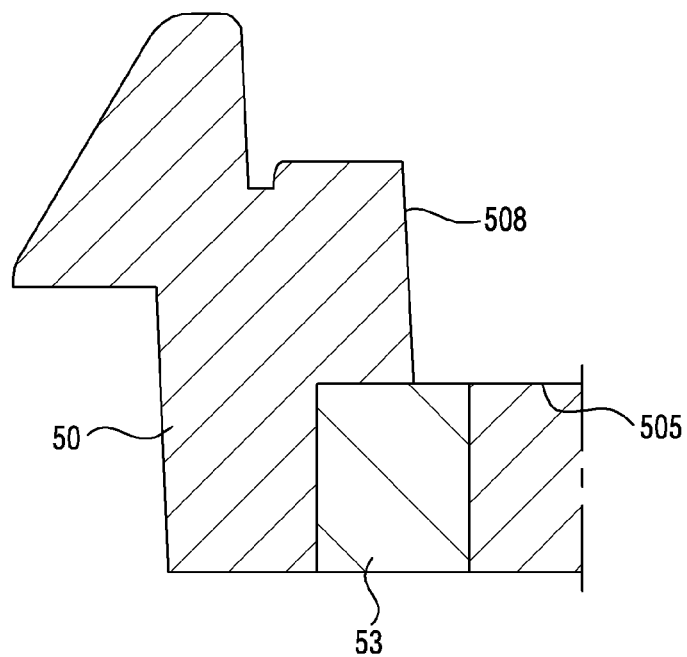
FIG. 13A is a cross-sectional view taken along line F-F' in FIG. 12C according to various embodiments.

FIG. 13A is a cross-sectional view taken along line F-F' in FIG. 12C according to various embodiments.

Referring to FIG. 13A, in the front case 50 manufactured according to various embodiments, at least one injection-molded marking part 53 may be disposed in an area between the first seating surface 505 and the first side wall 508.

Figure 13B:
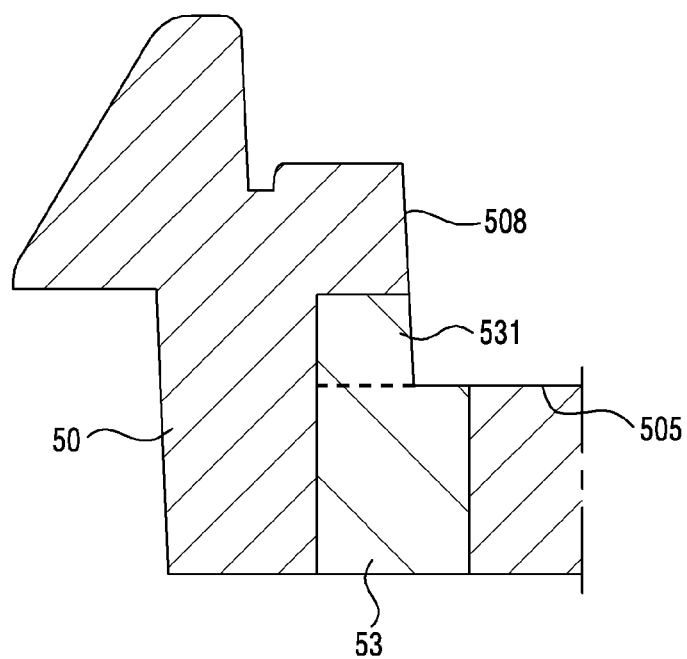
FIG. 13B is a cross-sectional view taken along line F-F' in FIG. 12C according to various embodiments and is a view illustrating another embodiment.

FIG. 13B is a cross-sectional view taken along line F-F' in FIG. 12C according to various embodiments, and is a view illustrating another embodiment.

Referring to FIG. 13B, the front case 50 manufactured according to various embodiments may include first and second injection-molded portions 53 and 531 disposed in an area between the first seating surface 505 and the first side wall 508 and in an area of the second side wall 508. With this structure, since it is possible to read a boundary between an injection-molded portion and a metal portion, it is possible to determine a reference application position of an adhesive material. Even in this case, the method illustrated in FIG. 11E can be used.

Figure 14A:
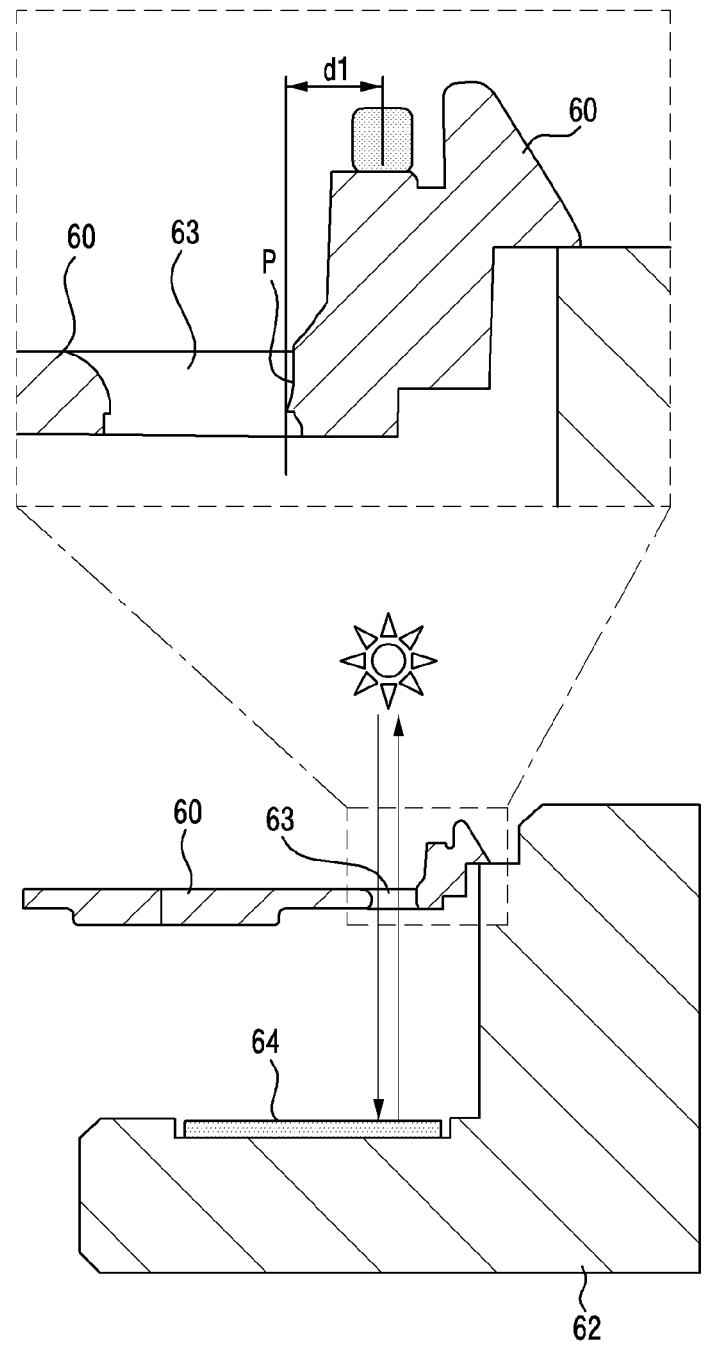
FIG. 14A is a cross-sectional view illustrating a device added to determine a reference application position disposed on a second seating surface of a front case according to various embodiments of the disclosure.
Figure 14B:
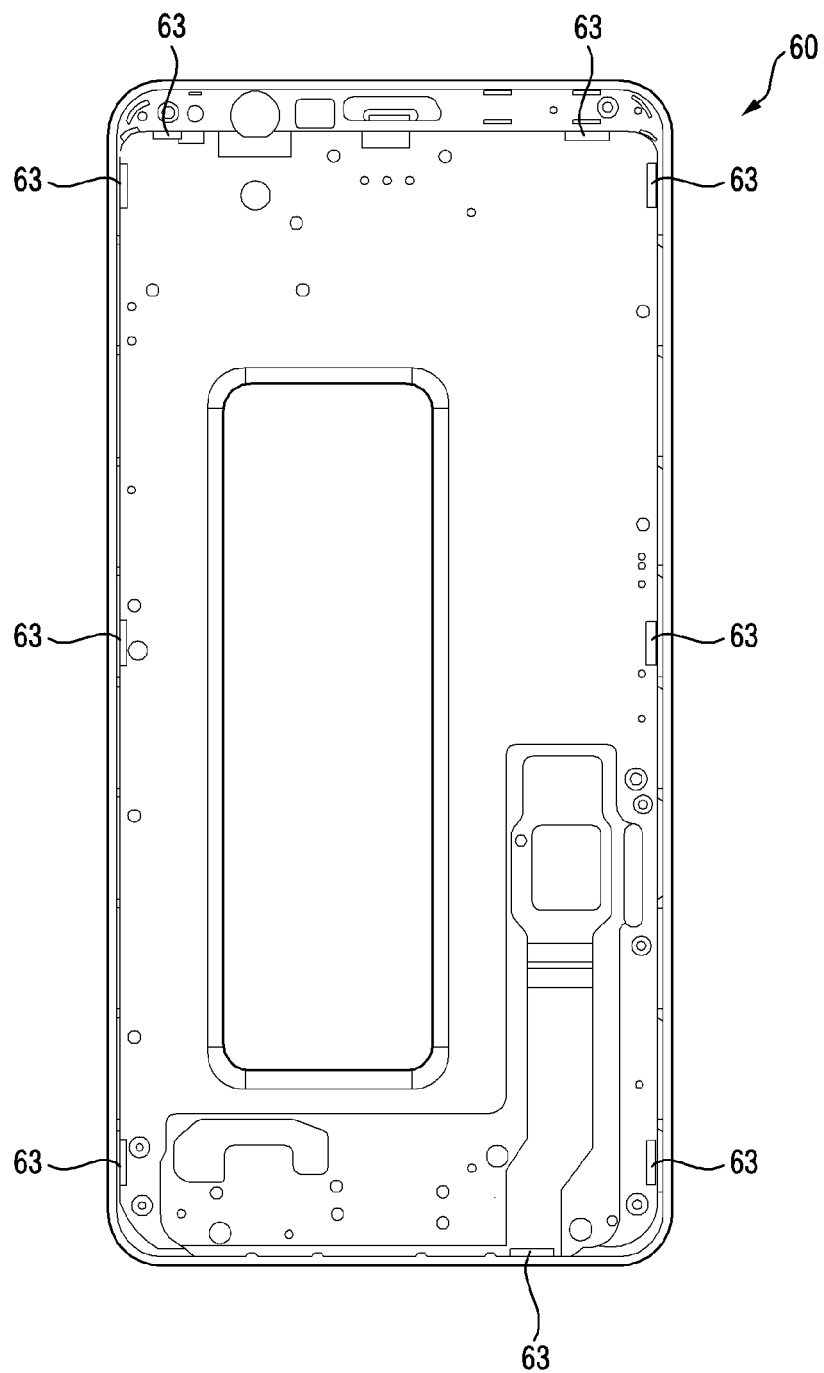
FIG. 14B is a plan view illustrating a front case adopted in FIG. 14A according to various embodiments.
Figure 14C:
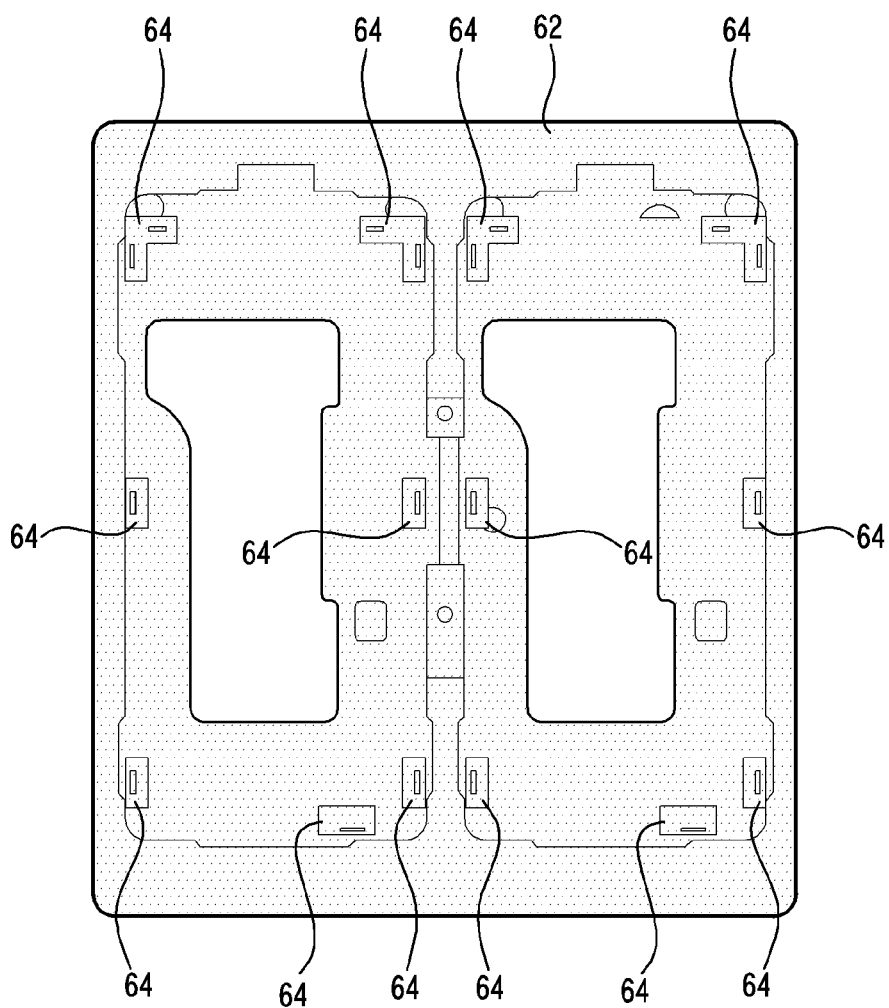
FIG. 14C is a plan view illustrating a carrier jig adopted in FIG. 14A according to various embodiments.
Figure 14D:
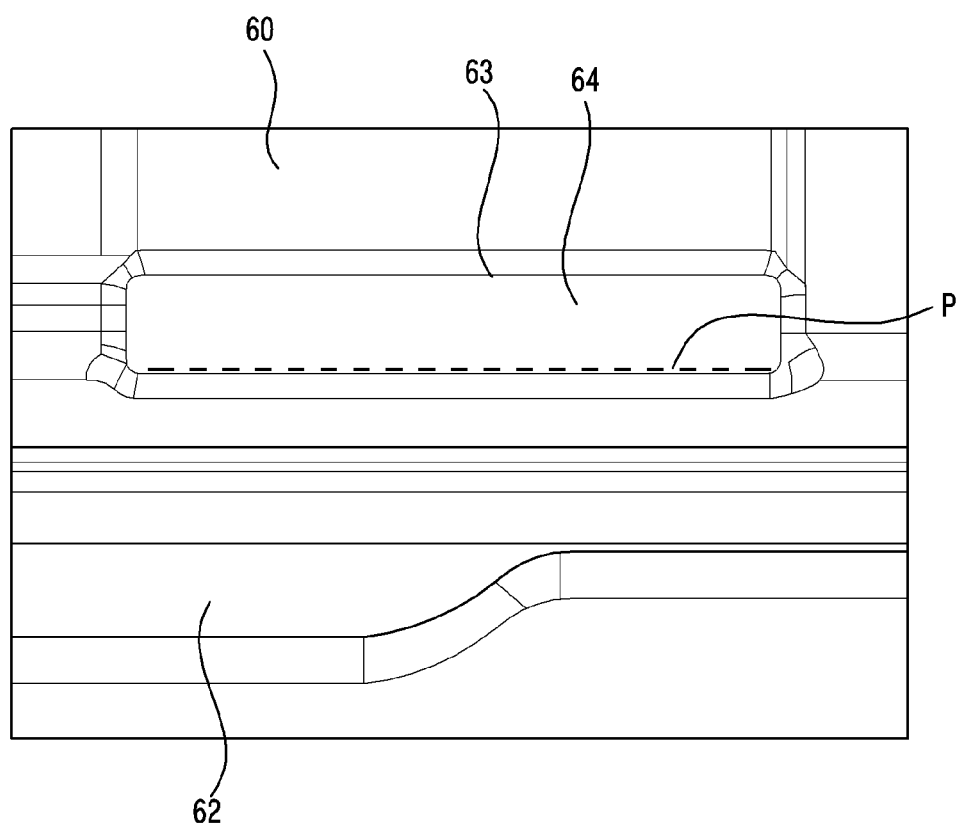
FIG. 14D is a plan view illustrating, on an enlarged scale, a portion of the carrier jig in which the front case adopted in FIG. 14A according to various embodiments is disposed.

FIG. 14A is a cross-sectional view illustrating a device added to determine a reference application position disposed on a second seating surface of a front case according to various embodiments of the disclosure. FIG. 14B is a plan view illustrating a front case adopted in FIG. 14A according to various embodiments. FIG. 14C is a plan view illustrating a carrier jig adopted in FIG. 14A according to various embodiments. FIG. 14D is a plan view illustrating, on an enlarged scale, a portion of the carrier jig in which the front case adopted in FIG. 14A according to various embodiments is disposed.

Referring to FIGS. 14A to 14D, an electronic device according to various embodiments may be different from the electronic device illustrated in FIGS. 8A and 8B in terms of the structure for recognizing an edge recognition point P. The electronic device 1000 illustrated in FIG. 8A determines the reference application position r of the adhesive material B using a marking part 43 and the edge recognition point P in which a difference in contrast is generated by the marking part 43. However, in an electronic device according to various embodiments, openings 63 formed in the first seating surface 405 of the front case and reflectors 64 disposed on a carrier jig 62 may be used.

The electronic device may be transferred in the state in which the front case 40 is placed on the carrier jig 62 for a process of coupling the front case and the display to each other. The front case 40 disposed on the transferred carrier jig 62 may be illuminated by a lighting device (not illustrated) provided in the dispensing device. The illuminating light passes through the openings 63 and illuminates the reflectors 64, and a difference in contrast between the reflectors 64 and the first seating surface may occur due to the reflected light. The edge recognition point may be determined based on the difference in contrast, and an adhesive material B may be applied to the reference application position r located on the second seating surface to be spaced apart from the edge recognition point by the first distance d1. The positions of the openings may be the same as the positions of the marking parts illustrated in FIG. 9. For example, each of the reflectors 64 may include a metal surface, a mirror, or the like.

Figure 15:
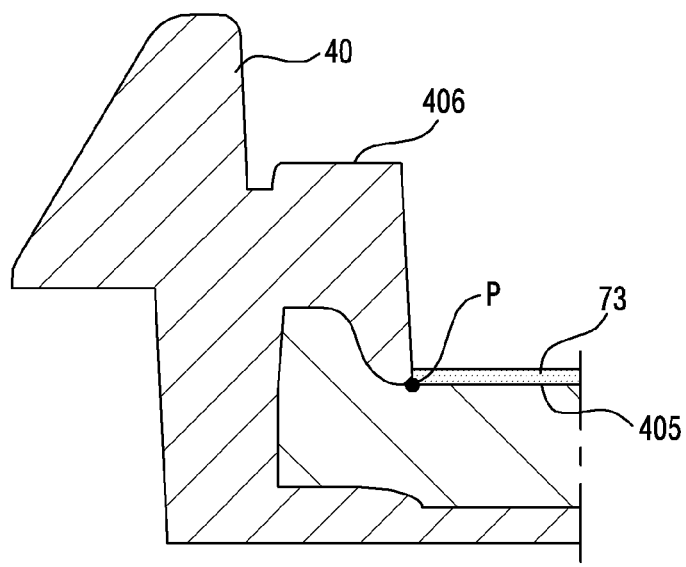
FIG. 15 is a cross-sectional view illustrating the state in which a marking part made of a coating film is disposed on a second seating portion of a front case according to various embodiments of the disclosure.

FIG. 15 is a cross-sectional view illustrating the state in which a marking part made of a coating film is disposed on a second seating portion of a front case according to various embodiments of the disclosure.

Referring to FIG. 15, in the front case 40 according to various embodiments, a marking part 73 disposed on the first seating surface 405 may be made of a painting film. For example, the painting film may be disposed on one surface of the front case 40 through a printing method. The position of the marking part 73 made of the painting film may be disposed at the same position as the position of the marking part 43 illustrate in FIG. 9. The painting color of the marking part 73 may be a color having a large difference in contrast compared to the color of the second seating surface 406. For example, if the first seating surface 405 of the front case 40 has a metallic color, the marking part 73 made of a painting film may have a white color. The marking part 73 may be formed through a painting process after masking.

Figure 16A:
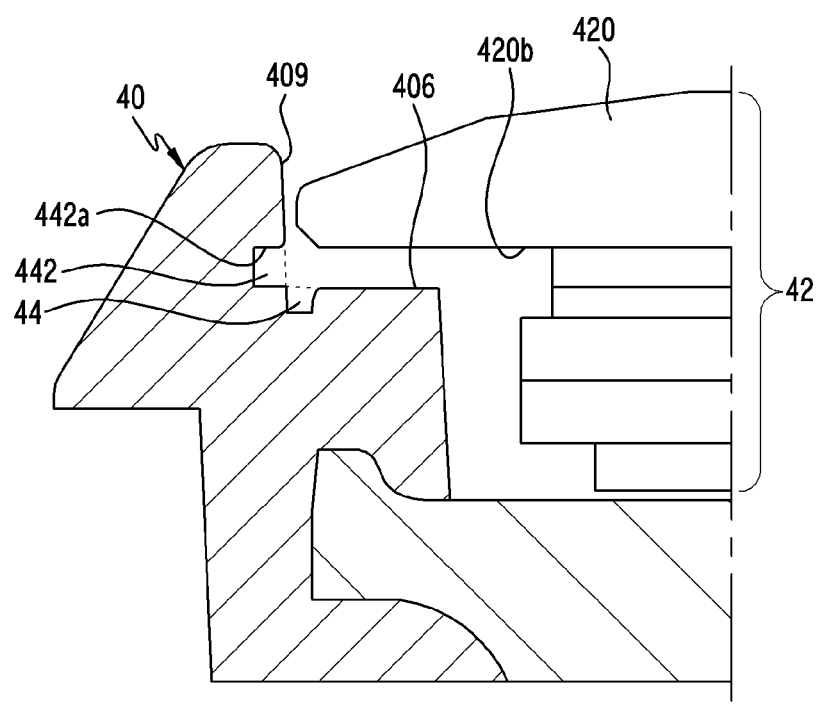
FIG. 16A is a cross-sectional view illustrating the state in which first and second escape grooves are defined in a second seating surface of a front case according to various embodiments of the disclosure.
Figure 16B:
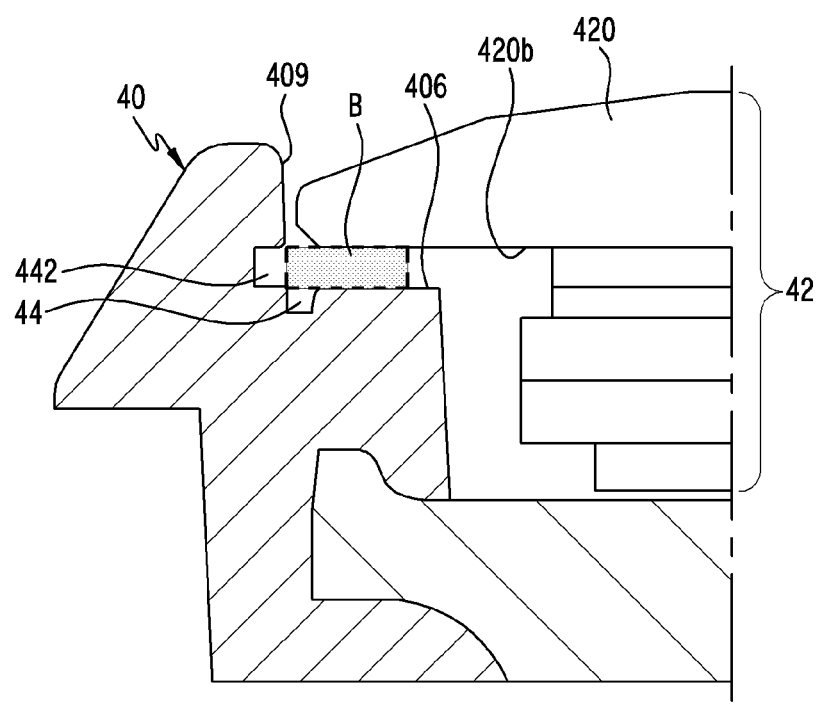
FIG. 16B is a cross-sectional view illustrating the state in which an adhesive material is applied to the second seating surface of the front case according to various embodiments of the disclosure.
Figure 16C:
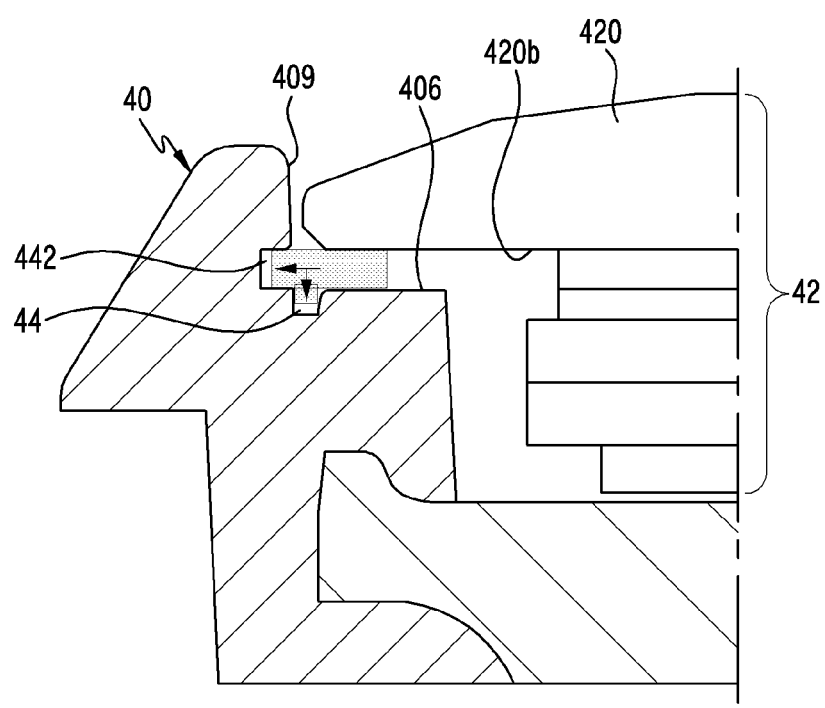
FIG. 16C is a cross-sectional view illustrating the state in which the adhesive material applied to the second seating surface of the front case according to various embodiments of the disclosure is moving to the first and second escape grooves.

FIG. 16A is a cross-sectional view illustrating the state in which first and second escape grooves are defined in a second seating surface of a front case according to various embodiments of the disclosure. FIG. 16B is a cross-sectional view illustrating the state in which an adhesive material is applied to the second seating surface of the front case according to various embodiments of the disclosure. FIG. 16C is a cross-sectional view illustrating the state in which the adhesive material applied to the second seating surface of the front case according to various embodiments of the disclosure is moving to the first and second escape grooves.

Referring to FIGS. 16A to 16C, an electronic device according to various embodiments may include a first escape groove 44 defined in the second seating surface 406 of the front case 40 and a second escape groove 442 defined in the second sidewall 409. For example, the first escape groove 44 may be recessed downwards from the second seating surface 406, and the second escape groove 442 may be recessed from the second sidewall 409 in a horizontal direction away from the window.

According to various embodiments, when the adhesive material B is applied to the second seating surface 406 of the front case and the display 42 is coupled, the applied adhesive material B is pressed by a portion of the window 420 so as to overflow to the left and right (to the outside and inside of the housing). Subsequently, the overflowing adhesive material flows into each of the first and second escape grooves 44 and 442 and fills the first and second escape grooves 44 and 442, respectively, that is, the overflowing adhesive material is accommodated in each of the first and second escape grooves, whereby it is possible to prevent the overflowing adhesive material from escaping to the inside and outside of the front case 40.

Each of the first and second escape grooves 44 and 442 may have various shapes, and multiple first escape grooves 44 and second escape grooves 442 may be formed. In addition, one or more first escape grooves 44 and one or more second escape grooves 442 may be defined along the edges of the front case 40, or may be defined along all of the edges so as to provide a closed curved path. In addition, any one of the first escape groove 44 and the second escape groove 442 may be defined in the second seating surface 406.

According to various embodiments, the top surface 442A of the second escape groove 442 may be aligned with or may be disposed above the bottom surface 420b of the window. The adhesive material B, which has overflowed due to this structure, may be guided into the second escape groove 442.

Figure 17A:
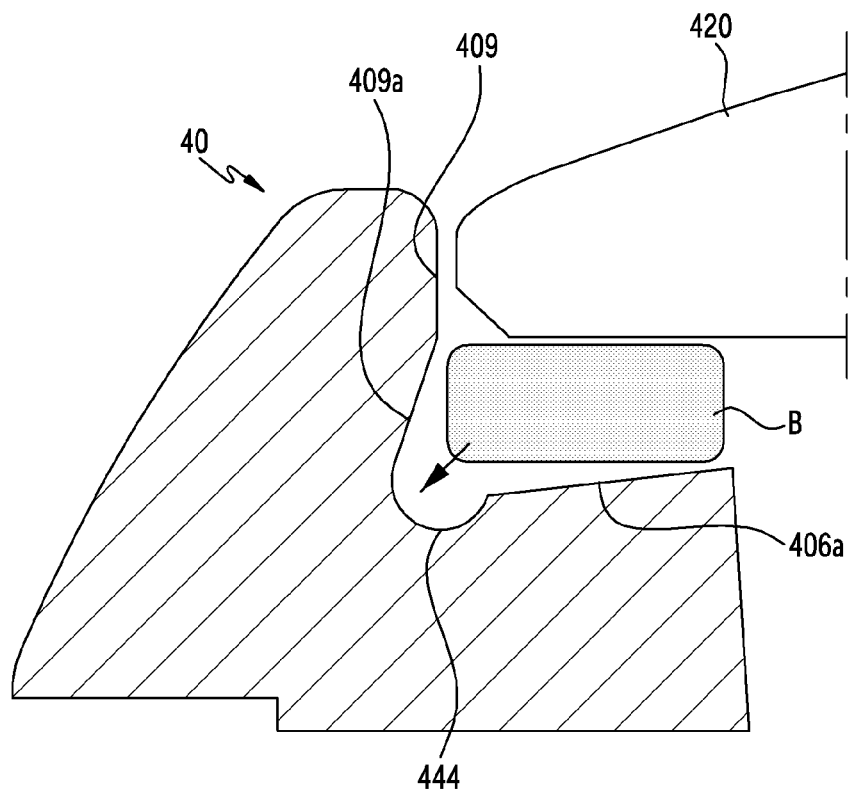
FIG. 17A is a cross-sectional view illustrating the state in which an adhesive material is applied to the second seating surface of the front case according to various embodiments of the disclosure.
Figure 17B:
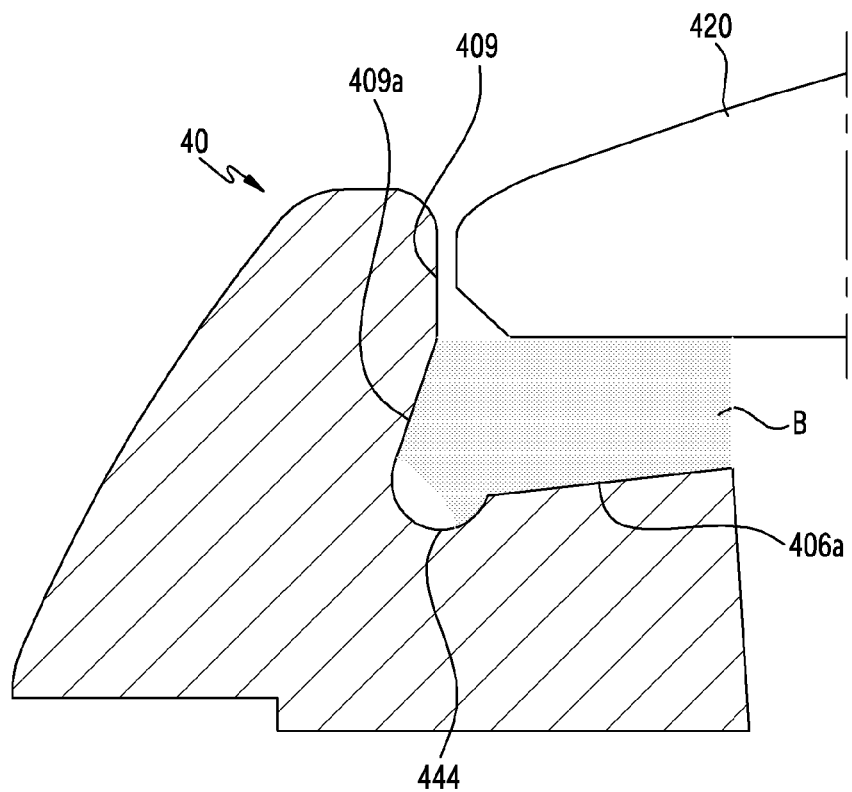
FIG. 17B is a cross-sectional view illustrating the state in which an empty space is generated after an adhesive material applied to the second seating surface of the front case according to various embodiments of the disclosure has filled an escape groove.

FIG. 17A is a cross-sectional view illustrating the state in which an adhesive material is applied to the second seating surface of the front case according to various embodiments of the disclosure. FIG. 17B is a cross-sectional view illustrating the state in which an empty space is generated after an adhesive material applied to the second seating surface of the front case according to various embodiments of the disclosure has filled an escape groove.

Referring to FIGS. 17A and 17B, according to various embodiments, at least one escape groove 444 may be defined in the front case 40 according to various embodiments. The escape groove 444 may be defined at a corner point where the second seating surface 406a and the second side wall 409a meet. In addition, the escape groove 444 may be recessed in a diagonal direction at the corner point. For example, the escape groove 444 may be formed in various shapes.

According to various embodiments, when the adhesive material B is applied to the second seating surface 406a of the front case and the window 420 of the display is coupled, the applied adhesive material B may be pressed by a portion of the window 420 and may overflow to the left and right. Subsequently, the overflowing adhesive material B flows into and fills the escape groove 444, that is, the overflowing adhesive material B is accommodated in the escape groove 444, whereby it is possible to prevent the overflowing adhesive material from escaping to the outside of the front case 40.

A plurality of escape grooves 444 may be defined in the front case 44. In addition, one or more escape grooves 444 may be defined along the edges of the front case 40, or may be defined along all of the edges thereof so as to provide a closed curved path.

According to various embodiments, the second seating surface 406a of the front case may be configured as an inclined surface so as to enable natural flow into the escape groove 444 by gravity, and the second side wall 409 may further include an inclined surface 409a to enable natural flow into the escape due to gravity.

Figure 18A:
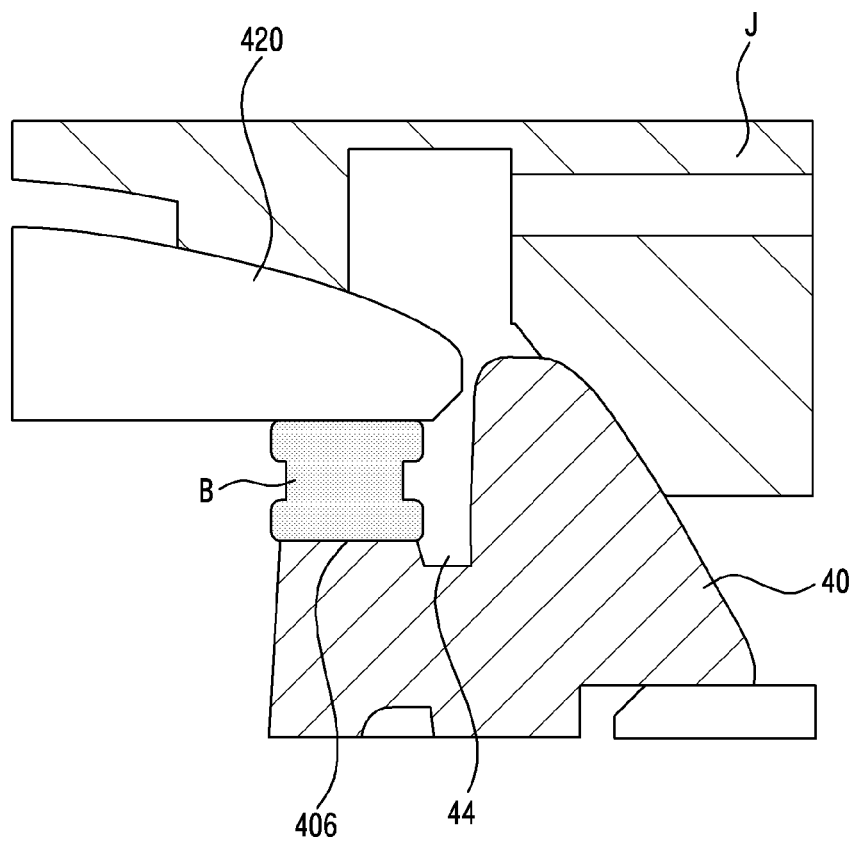
FIG. 18A is a cross-sectional view illustrating the state in which air is sprayed onto an applied adhesive material in the state in which a front case and a display according to various embodiments of the disclosure are pressed by an upper plate jig.
Figure 18B:
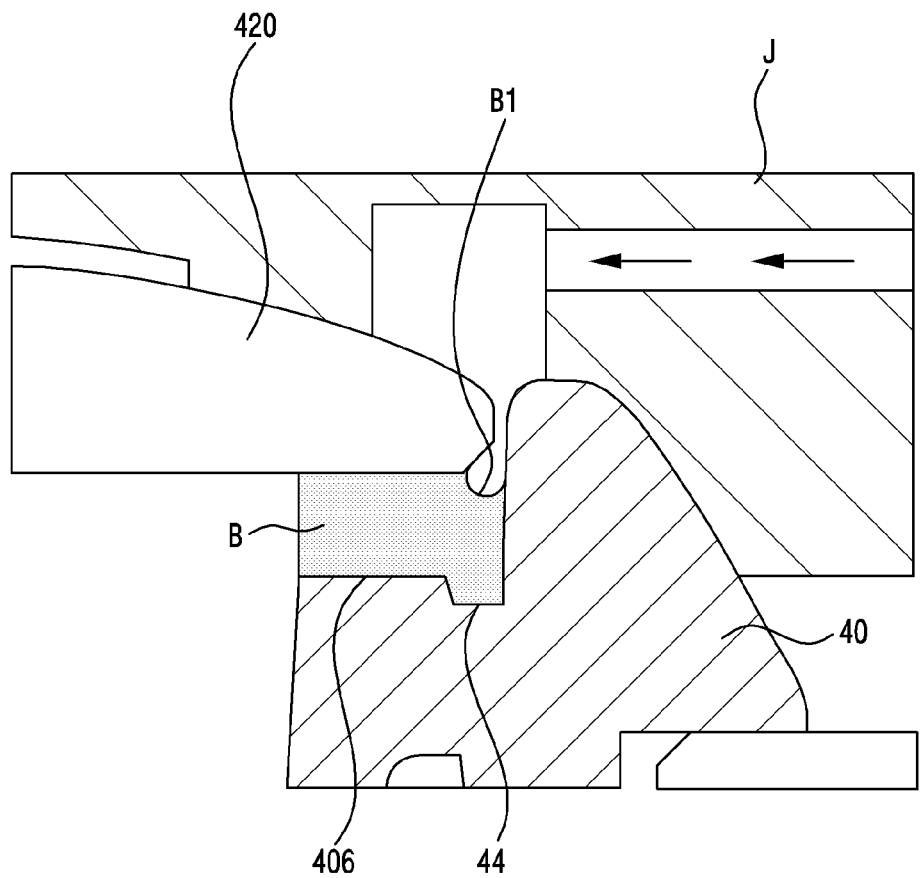
FIG. 18B is a cross-sectional view illustrating the state in which a sink portion is generated after air is sprayed onto an applied adhesive material in the state in which the front case and the display according to various embodiments of the disclosure are pressed by the upper plate jig.

FIG. 18A is a cross-sectional view illustrating the state in which air is sprayed onto an applied adhesive material in the state in which a front case and a display according to various embodiments of the disclosure are pressed by an upper plate jig. FIG. 18B is a cross-sectional view illustrating the state in which a sink portion is generated after air is sprayed onto an applied adhesive material in the state in which the front case and the display according to various embodiments of the disclosure are pressed by the upper plate jig.

Referring to FIGS. 18A and 18B, in the front case 40 according to various embodiments, an adhesive material B is applied to the second seating surface 406, the window 420 of the display is then placed on the applied adhesive material B, and then the window 420 may be pressed using the upper plate jig J. At this time, the applied adhesive material B may flow into the escape groove 44, and air may be simultaneously injected so as to prevent the applied adhesive material from escaping to the outside. The applied adhesive material B cannot flow out to the outside by air pressure, and as a result, the adhesive material B enters the escape groove, and a sink portion B1 may occur on the upper surface of the adhesive material.

The timing of air injection to the applied adhesive material B located in the gap between the front case and the window is performed simultaneously with the state in which the window 420 is placed on the applied adhesive material B, or just before, simultaneously with, or just after an operation of pressing an upper plate jig (not illustrated) on the window. For example, the upper plate jig may include an elastic rubber material (e.g., rubber or silicon).

Figure 19A:
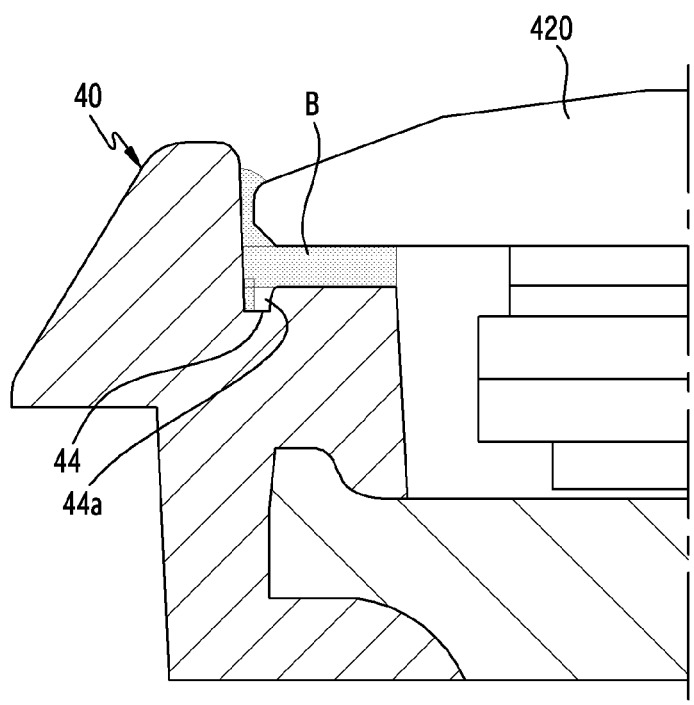
FIG. 19A is a cross-sectional view illustrating the state in which an empty space is generated after an adhesive material applied to the second seating surface of the front case according to various embodiments of the disclosure has filled an escape groove.
Figure 19B:
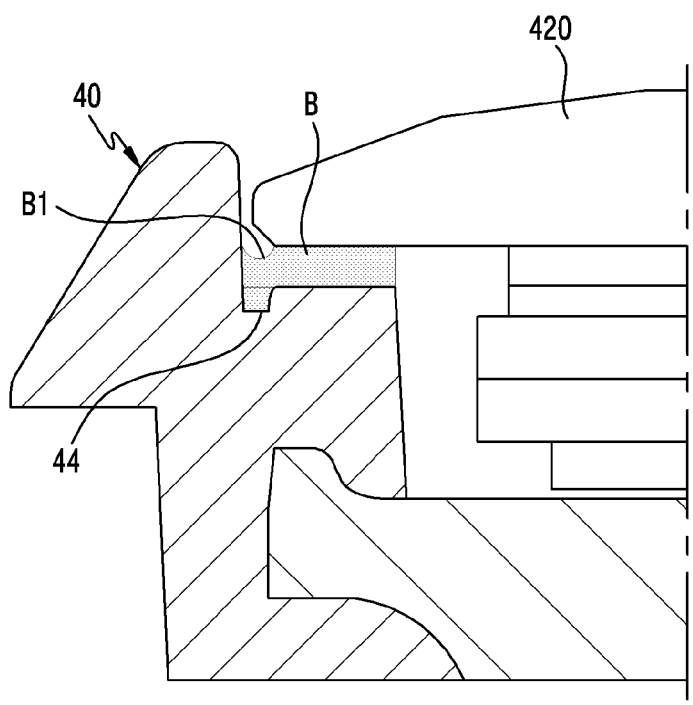
FIG. 19B is a cross-sectional view illustrating the state in which a sink portion is generated after air is sprayed onto an applied adhesive material in the state in which the front case and the display according to various embodiments of the disclosure are pressed by the upper plate jig.

FIG. 19A is a cross-sectional view illustrating the state in which an empty space is generated after an adhesive material applied to the second seating surface of the front case according to various embodiments of the disclosure has filled an escape groove. FIG. 19B is a cross-sectional view illustrating the state in which a sink portion is generated after air is sprayed onto an applied adhesive material in the state in which the front case and the display according to various embodiments of the disclosure are pressed by the upper plate jig.

Referring to FIGS. 19A and 19B, in the front case 40 according to various embodiments, when the window 420 of the display is attached after applying the adhesive material B to the second seating surface 406, some of the applied adhesive material B may move to the escape groove 44, and an empty space 44a may be present in the escape groove 44. When air is sprayed to the applied adhesive material B, the adhesive material is prevented from flowing out to the outside of the window. As a result, the adhesive material B may flow into the escape groove 44, and a sink portion B1 may be generated on the upper surface of the adhesive material B.

The shape and size of the sink portion B1 may vary depending on the amount of the adhesive material.

Figure 20:
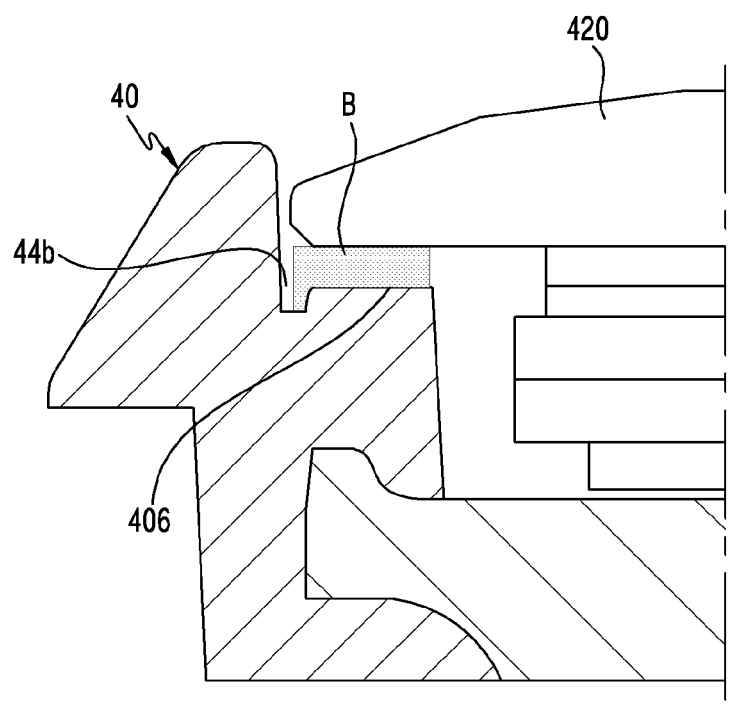
FIG. 20 is a cross-sectional view illustrating the state in which a partial empty space is generated in an escape groove after air is sprayed onto an applied adhesive material in the state in which a front case and a display according to various embodiments of the disclosure are attached to each other.

FIG. 20 is a cross-sectional view illustrating the state in which a partial empty space is generated in an escape groove after air is sprayed onto an applied adhesive material in the state in which a front case and a display according to various embodiments of the disclosure are attached to each other.

Referring to FIG. 20, in the front case 40 according to various embodiments, when an adhesive material B is applied to the second seating surface 406 and then the window 420 of the display is attached, some of the applied adhesive material B may move into the escape groove 44, and thus the applied adhesive material B may be prevented from overflowing. However, the adhesive material B may not completely fill the escape groove 44, and there may be an unfilled empty space 44b.

Figure 21A:
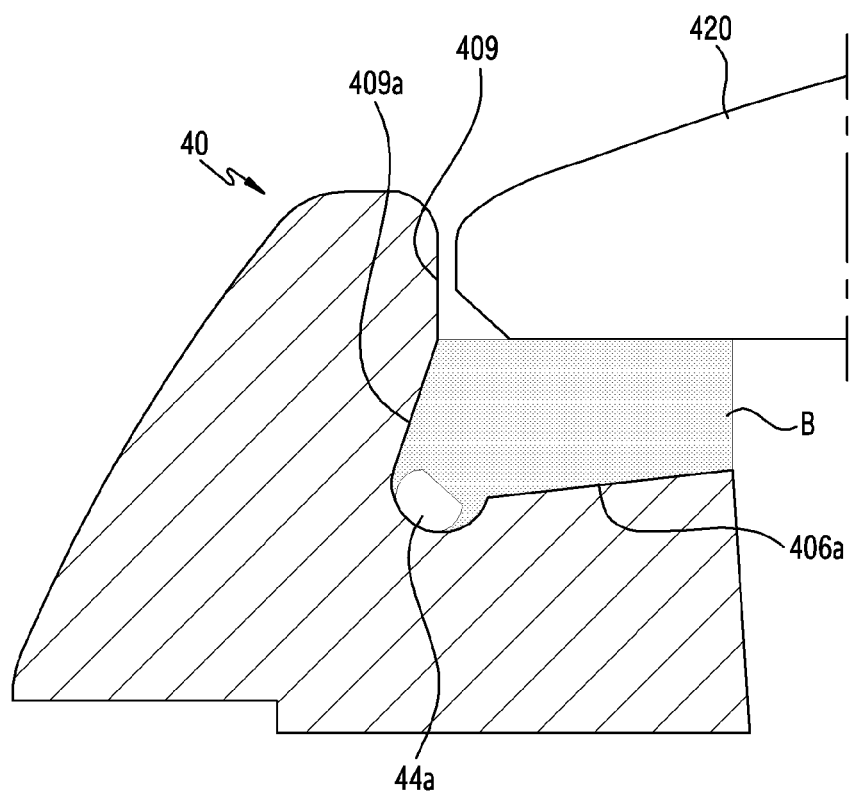
FIG. 21A is a cross-sectional view illustrating the state in which a partial empty space is generated in a diagonally recessed escape groove after air is sprayed onto an applied adhesive material in the state in which a front case and a display according to various embodiments of the disclosure are attached to each other.
Figure 21B:
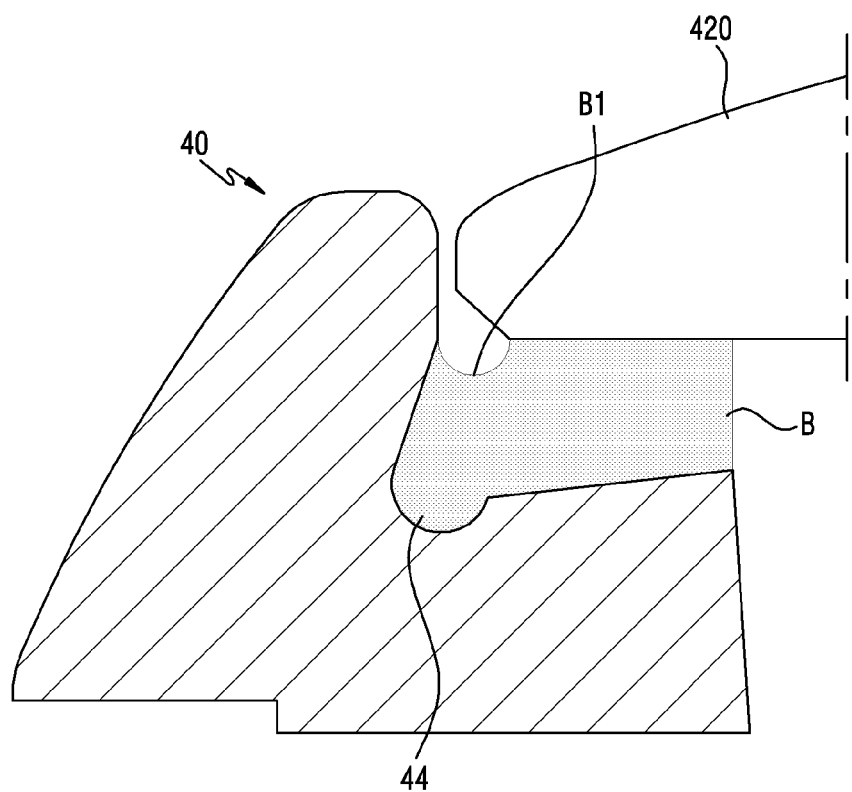
FIG. 21B is a cross-sectional view illustrating the state in which a sink portion is generated after air is sprayed onto an applied adhesive material in the state in which a front case and a display according to various embodiments of the disclosure are attached to each other.

FIG. 21A is a cross-sectional view illustrating the state in which a partial empty space is generated in a diagonally recessed escape groove after air is sprayed onto an applied adhesive material in the state in which a front case and a display according to various embodiments of the disclosure are attached to each other. FIG. 21B is a cross-sectional view illustrating the state in which a sink portion is generated after air is sprayed onto an applied adhesive material in the state in which a front case and a display according to various embodiments of the disclosure are attached to each other.

Referring to FIGS. 21A and 21B, in the front case 40 according to various embodiments, when the window 420 of the display is attached after applying the adhesive material B to the second seating surface 406, some of the applied adhesive material B may move into the diagonally recessed escape groove 44, and thus the applied adhesive material may be prevented from overflowing. In the escape groove, there may be an empty space 44A that is not filled with the adhesive material. By pressing the upper surface of the adhesive material B by air, a sink portion B1 may be generated.

Figure 22:
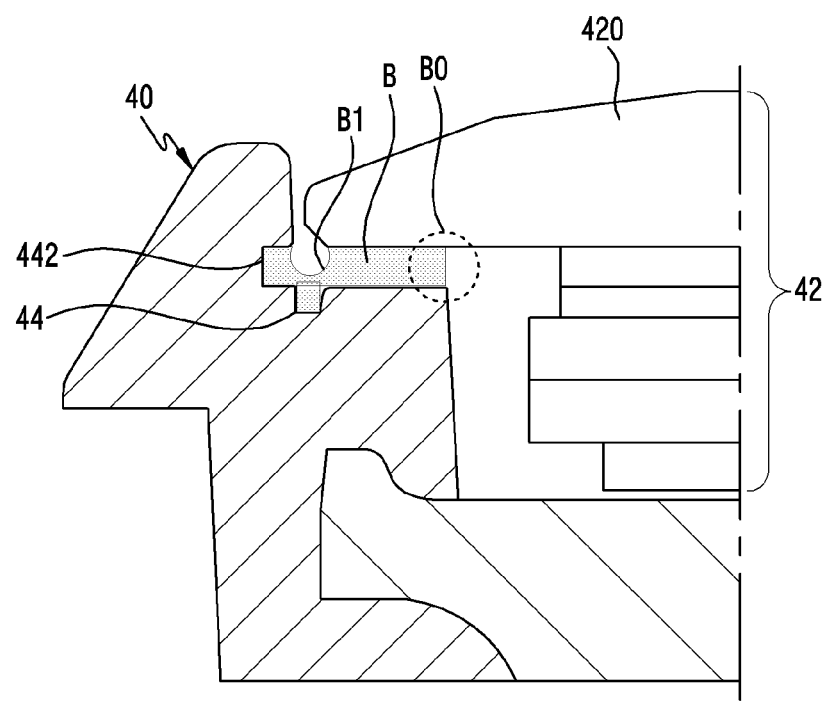
FIG. 22 is a cross-sectional view illustrating the state in which first and second escape grooves are filled with an adhesive material and a sink portion is generated after air is sprayed onto the applied adhesive material in the state in which a front case and a display according to various embodiments of the disclosure are attached to each other.

FIG. 22 is a cross-sectional view illustrating the state in which first and second escape grooves is filled with an adhesive material and a sink portion is generated after air is sprayed onto the applied adhesive material in the state in which a front case and a display according to various embodiments of the disclosure are attached to each other.

Referring to FIG. 22, in the front case 40 according to various embodiments, when the window 420 of the display is attached after applying the adhesive material B to the second seating surface 406, some of the applied adhesive material B may move into first and second escape grooves 44 and 442, and thus the applied adhesive material B may be prevented from overflowing.

In addition, by pressing the adhesive material B using air, a sink portion B1 may be generated.

Figure 23:
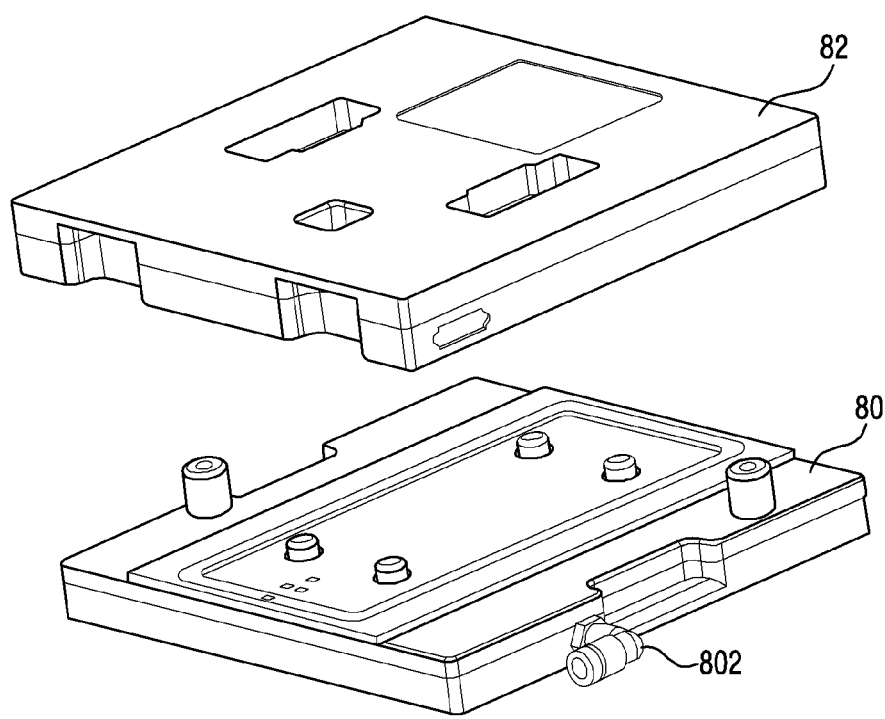
FIG. 23 is a perspective view illustrating upper and lower plate jigs according to various embodiments of the disclosure in the state in which an air inlet is provided in the upper plate jig.

FIG. 23 is a perspective view illustrating upper and lower plate jigs according to various embodiments of the disclosure in the state in which an air inlet is provided in the upper plate jig.

Referring to FIG. 23, a process of pressing the front case in the attached state in the up-and-down direction may be performed. The front case and the display are squeezed in the attached state by the upper and lower plate jigs 8 and 82, and an air inlet 802 is provided in the upper plate jig 80 in order to spray air onto the partially pressed adhesive material. When an air tank (not illustrated) is connected to the air inlet 802 and the valve is turned on, air may be sprayed onto the applied adhesive material in the attached state.

Hereinafter, a process of coupling a display 42 to a front case 40 according to various embodiments will be described with reference to the accompanying drawings.

Figure 24:
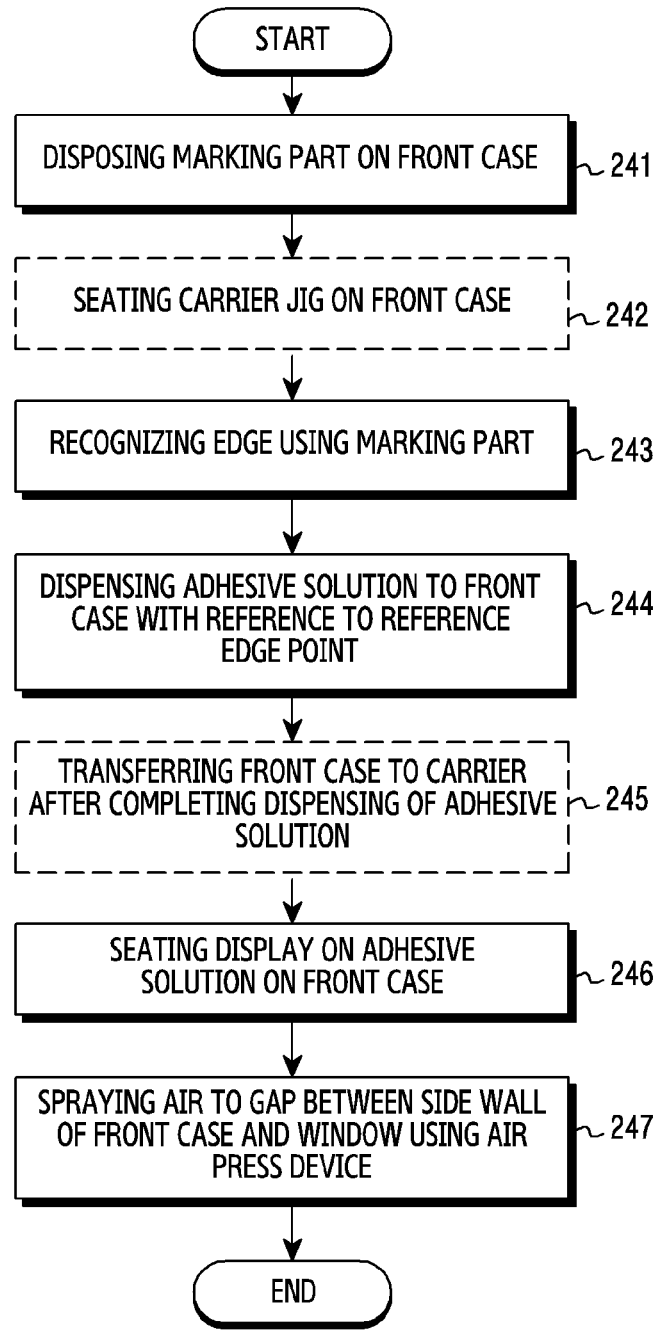
FIG. 24 is a flowchart sequentially illustrating a process of coupling a display to a front case according to various embodiments of the disclosure.

FIG. 24 is a flowchart sequentially illustrating a process of coupling a display to a front case according to various embodiments of the disclosure.

Referring to FIG. 24, one or more marking parts (e.g., the marking parts 431 to 434 in FIG. 9) may be formed using a laser on a front case 40 (e.g., the front case 40 of FIG. 9) according to various embodiments (operation 241).

A plurality of front cases 40, in each of which at least one marking part is disposed, may be seated on a plurality of carrier jigs. This operation may be optional (operation 242).

A dispensing device may be disposed on each of the front cases 40 disposed on the carrier jigs. The disposed dispensing device may be equipped with a vision camera.

The positions of the marking parts of each front case 40 can be recognized by the vision camera mounted on the front case 40 (operation 243).

An adhesive material B may be dispensed on the first seating surface 405 of the front case 40 by recognizing an edge recognition point based on the recognized position of the marking part (operation 244).

After dispensing the adhesive material on the front case 40, the carrier jig may be transferred. This operation may be optional (operation 245).

After the carrier jig is transferred, the window 420 of the display may be seated on the applied adhesive material. This state may be the state in which the front case 40 and the window 420 are attached to each other (operation 246).

In this state, air may be sprayed into the gap between the second sidewall of the front case 40 and the end of the window 420 at a predetermined pressure using an air press device (operation 247).

After a predetermined period of time, the front case 40 and the display may be firmly coupled to each other by the adhesive material.

Figure 25:
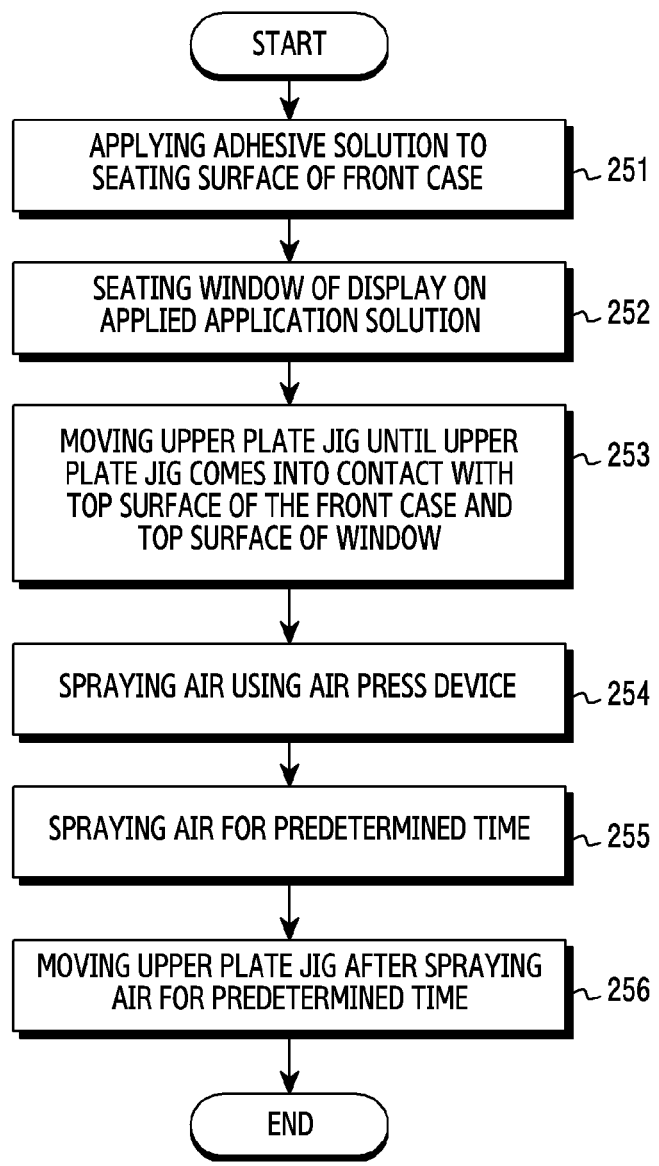
FIG. 25 is a flowchart sequentially illustrating another process of coupling a display to a front case according to various embodiments of the disclosure.

FIG. 25 is a flowchart sequentially illustrating another process of coupling a display to a front case according to various embodiments of the disclosure.

A process of coupling a display to a front case 40 according to various embodiments will be described with reference to FIG. 25.

Referring to FIG. 25, in a prepared front case (e.g., the front case 40 of FIG. 10B) according to various embodiments, an adhesive material may be applied to a first seating surface 405 by a dispensing device (operation 251).

Subsequently, the window 420 of the display (e.g., the window 420 in FIG. 8B) may be seated on the applied adhesive material. This state may be the state in which the front case 40 and the window 420 are attached to each other (operation 252).

In the case in which the display is attached to the front case 40, the upper plate jig (e.g., the upper plate jig J in FIG. 18A) may move downwards until the upper plate jig comes into contact with the top surface of the front case 40 and the top surface of the window 420 (operation 253).

In the state in which the upper jig moves and presses the front case 40 and the window 420 with a predetermined pressure, air may be sprayed onto the applied adhesive material existing in the gap between the second side wall and the end of the window 420 using air by an air press device (operation 254).

The air can be sprayed up to a set time (operation 255).

After a predetermined time, during which the upper plate jig presses the front case 40 and the window 420, has elapsed, the upper plate jig may rise upwards, and thus the process of coupling the display to the front case 40 can be completed (operation 256).

In the above description, it has been described by way of example that at least one marking part is disposed on at least a portion of the first seating surface in order to recognize the boundary line between the first seating surface and the second seating surface. However, this is merely an example, and the disclosure is not limited thereto.

For example, according to various embodiments, a dispensing device (or a vision camera) may recognize a boundary line between the first seating surface and the second seating surface on the front case on which no marking part is disposed, as will be described later with reference to FIGS. 26A to 26C.

Figure 26A:
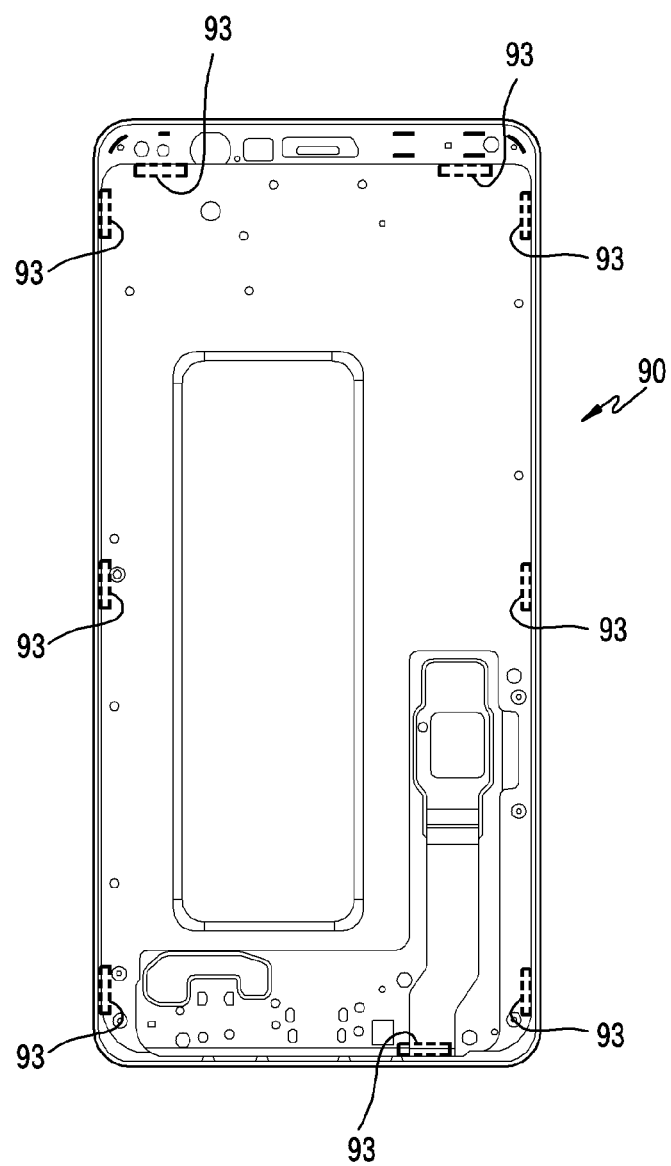
FIG. 26A is a plan view illustrating a front case in which at least one arbitrary marking part is disposed according to various embodiments of the disclosure.

FIG. 26A is a plan view illustrating a front case on which no marking part is disposed according to various embodiments of the disclosure. FIG. 26B is an enlarged view of a part of the scan area of FIG. 26A. FIG. 26C is a cross-sectional view taken along line GG in FIG. 26B.

Figure 26B:
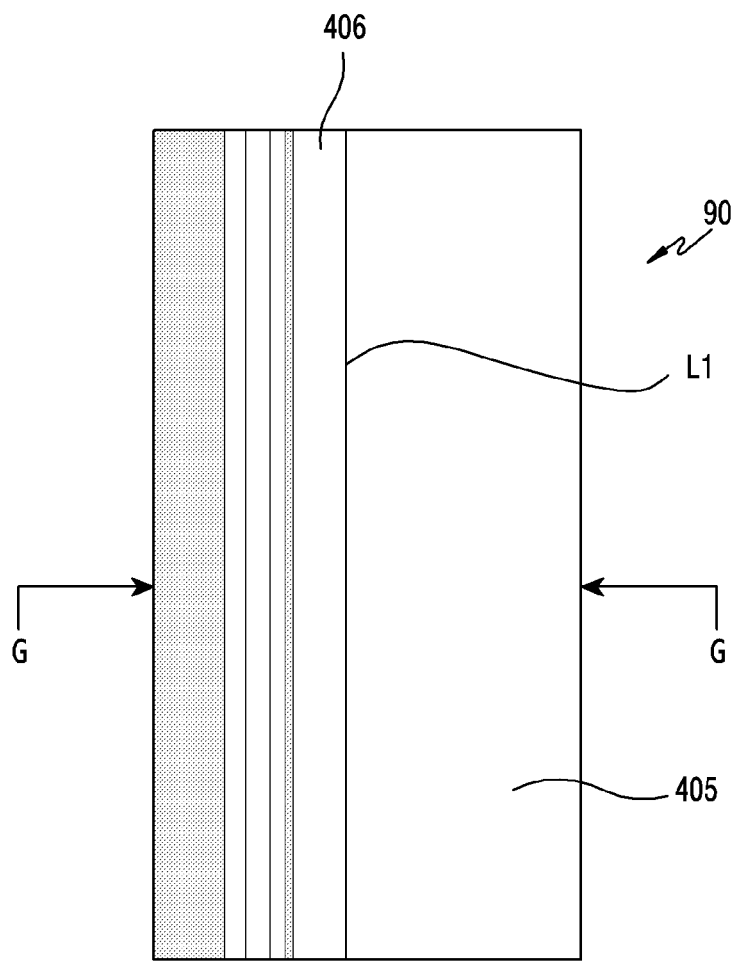
FIG. 26B is an enlarged view of a part of the scan area of FIG. 26A.
Figure 26C:
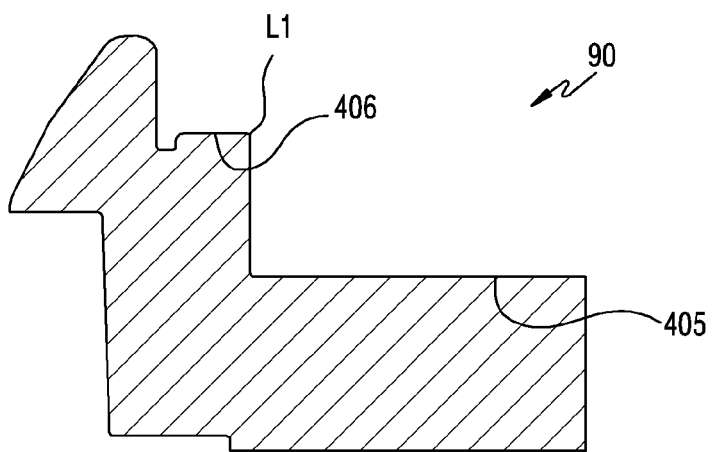
FIG. 26C is a cross-sectional view taken along line GG in FIG. 26B.

Referring to FIGS. 26A to 26C, according to various embodiments, a front case 90 (e.g., the front case 40 in FIG. 10B) may include a first seating surface 405 and a second seating surface 406, which are configured in a stepped shape. At least a portion of the front case including the portion in which the first seating surface 405 and the second seating surface 406 meet may be set as at least one recognition area (e.g., A in FIG. 11A) for recognizing the boundary between the first seating surface 405 and the second seating surface 406. For example, the recognition area may be a scan area of a vision camera (not illustrated).

After the at least one recognition area according to various embodiments is set, the set recognition area (e.g., at least a portion of the front case including a portion in which the first and second seating surfaces 405 and 406 meet) may be scanned using a vision camera (not illustrated), and the black boundary line L1 can be seen. For example, as illustrated in FIG. 26C, due to the first seating surface 405 having a first height and the second seating surface 406 having a second height different from the first height, a difference in contrast may occur between the first seating surface and the second seating surface. That is, the vision camera may recognize the boundary line L1 using the contrast that appears after scanning the recognition area from the first seating surface 405 to the second seating surface 406 or from the second seating surface 406 to the first seating surface 405. For example, the boundary line L1 between the first and second seating surfaces 405 and 406 may be an edge line of the second seating surface 406.

Because the boundary line L1 between the first and second seating surfaces 405 and 406 is recognized based on contrast, the adhesive material application position on the second seating surface 406 may be set.

As described above, the method of using a front case, which is provided with marking parts, makes it possible to more clearly recognize a boundary line compared to the method of using a front case, which is not provided with marking parts. As a result, it is possible to increase coupling force between the front case and another component (e.g., a display). On the other hand, the method of using a front case, which is not provided with a marking part, makes it possible to reduce the process time and cost for coupling the front case and another component (e.g., a display) to each other compared to the method of using a front case, which is not provided with a marking part.

According to various embodiments of the disclosure, an electronic device may include: a case (e.g., the case 40 illustrated in FIG. 8B) including a first plate oriented in a first direction, a second plate oriented in a second direction that is opposite to the first direction, and a side member (e.g., the side member 119 in FIG. 1) that surrounds at least a portion of a space between the first plate and the second plate; a display (e.g., the display 42 in FIG. 8B) including a window (e.g., the window 420 illustrated in FIG. 8B) and disposed on the first plate of the case (e.g., the case 40 illustrated in FIG. 8); an adhesive material that allows the display to be bonded to the case (e.g., the case 4 illustrated in FIG. 8B); a first seating surface (e.g., the first seating surface 405 in FIG. 8B) of the case (e.g., the case 40 illustrated in FIG. 8B) on which at least a portion of the display is seated; a second seating surface (e.g., the second seating surface 406 in FIG. 8B) of the case (e.g., the case 40 illustrated in FIG. 8B) to which the window is attached; at least one marking part (e.g., the marking part 43 in FIG. 8B) disposed on the first seating surface; and at least one escape groove (e.g., the escape groove 44 in FIG. 8B) defined in the second seating surface.

According to an embodiment of the disclosure, an adhesive material application position may be located between the marking part (e.g., the marking part 43 illustrated in FIG. 8B) and the escape groove.

According to an embodiment of the disclosure, the marking part (e.g., the marking part 43 illustrated in FIG. 8B) may be configured to allow a reference application position at which the adhesive material is applied to the second seating surface to be determined.

According to an embodiment of the disclosure, the escape groove (e.g., the escape groove 44 illustrated in FIG. 8B) may be configured to prevent the applied adhesive material from overflowing.

According to an embodiment of the disclosure, the case (e.g., the case 40 illustrated in FIG. 8B) may further include a first material portion, (e.g., the first material portion 40-1 illustrated in FIG. 8B) and a second material portion (e.g., the second material portion 40-2 illustrated in FIG. 8B) that is insert-injection-molded with the first material portion (e.g., the first material portion 40-1 illustrated in FIG. 8B) and is made of a material different from that of the first material portion (e.g., the first material portion 40-1 illustrated in FIG. 8B), and the marking part (e.g., the marking part 43 illustrated in FIG. 8B) may be disposed on the second material portion (e.g., the second material portion 40-2 illustrated in FIG. 8B).

According to an embodiment of the disclosure, the first material portion (e.g., the first material portion 40-1 illustrated in FIG. 8B) may be made of a plastic material, and the second material portion (e.g., the second material portion 40-2 illustrated in FIG. 8B) may be made of a metal material.

According to an embodiment of the disclosure, the case (e.g., the case illustrated in FIG. 8B) may include first to fourth edges, and the marking part (e.g., the marking part 43 illustrated in FIG. 8B) has a shape extending along one of the edges (e.g., the first to fourth edges 401 to 404 in FIG. 9) of the case (e.g., the case 40 illustrated in FIG. 8B), and at least one marking part may be disposed on at least one of the edges.

According to an embodiment of the disclosure, the marking part (e.g., the marking part 43 illustrated in FIG. 8B) may be processed using a laser.

According to an embodiment of the disclosure, the marking part (e.g., the marking part 43 illustrated in FIG. 8B) may be made using a paining film or through insert injection molding.

According to an embodiment of the disclosure, the reference application position (e.g., the reference application position r in FIG. 10B) may be determined by determining an edge recognition point (e.g., the edge recognition point P in FIG. 9) distinguished based on a difference in color or a difference in contrast, wherein the reference application position is located on the second seating position at a first distance d1 from a vertical line extending from the edge recognition point.

According to an embodiment of the disclosure, the escape groove (e.g., the escape grooves 44 and 442 illustrated in FIG. 8B) may be recessed in the second direction, may be recessed away from the window in a direction perpendicular to the second direction, or may be recessed in a diagonal direction between the second direction and the direction oriented away from the window.

According to an embodiment of the disclosure, the electronic device may further include a first side wall (e.g., the first side wall 408 in FIG. 10B) disposed between the first and second seating surfaces, and a second side wall (e.g., the second side wall 409 in FIG. 10B) disposed between an upper end of the case and the second seating surface.

According to an embodiment of the disclosure, the first side wall (e.g., the first side wall 408 in FIG. 10B) may be inclined so as to cause the applied adhesive material to flow into the escape groove (e.g., the escape groove 44 illustrated in FIG. 8B), and the second side wall (e.g., the second side wall 409 in FIG. 10B) may include an inclined surface so as to cause the applied adhesive material to flow into the escape groove (e.g., the escape groove 44 illustrated in FIG. 8B).

According to an embodiment of the disclosure, the adhesive material may have at least one sink hole (e.g., the sink hole B1 in FIG. 18B) formed therein.

According to an embodiment of the disclosure, the marking part (e.g., the marking part 43 illustrated in FIG. 8B) may have a shape extending along an edge of the case (e.g., the case 40 illustrated in FIG. 8B).

The embodiments of the disclosure described and shown in the specification and the drawings have been presented to easily explain the technical contents of the disclosure and help understanding of the disclosure, and are not intended to limit the scope of the disclosure. Therefore, the scope of the disclosure should be construed to include, in addition to the embodiments disclosed herein, all changes and modifications derived on the basis of the technical idea of the disclosure.

The invention claimed is:

1. An electronic device comprising:
a case including a front plate oriented in a first direction, a rear plate oriented in a second direction that is opposite to the first direction, and a side member that surrounds at least a portion of a space between the front plate and the rear plate;
a display disposed below the front plate;
an adhesive material that allows the display to be bonded to the case;
a first seating surface of the case on which at least a portion of the display is seated;
a second seating surface of the case to which the front plate is attached;
a first side wall disposed between the first and second seating surfaces;
a second side wall disposed between an upper end of the case and the second seating surface;
at least one marking part disposed on the first seating surface; and
at least one of a first escape groove or a second escape groove defined in the second seating surface, wherein the first escape groove is recessed from the second seating surface in the second direction, and the second escape groove is recessed from the second side wall in a direction perpendicular to the second direction and in a direction oriented away from the front plate.

2. The electronic device of claim 1, wherein an adhesive material application position is located between the marking part and the escape groove.

3. The electronic device of claim 2, wherein the marking part has a shape extending along an edge of the case.

4. The electronic device of claim 1, wherein the marking part is configured to allow a reference application position, at which the adhesive material is applied to the second seating surface, to be determined.

5. The electronic device of claim 4, wherein the reference application position is determined by determining an edge recognition point distinguished based on a difference in color or a difference in contrast, the reference application position being located on the second seating position at a first distance from a vertical line extending from the edge recognition point.

6. The electronic device of claim 1, wherein the escape groove is configured to prevent the applied adhesive material from overflowing.

7. The electronic device of claim 1, wherein the case further comprises a first material portion, and a second material portion that is insert-injection-molded with the first material portion and is made of a material different from a material of the first material portion, and
wherein the marking part is disposed on the second material portion.

8. The electronic device of claim 7, wherein the first material portion is made of a plastic material, and the second material portion is made of a metal material.

9. The electronic device of claim 1, wherein the case comprises first to fourth edges, and
the marking part has a shape extending along one of the edges of the case, and at least one marking is disposed on at least one of the edges.

10. The electronic device of claim 1, wherein the marking part is processed using a laser.

11. The electronic device of claim 1, wherein the marking part is made using a paining film or through insert injection molding.

12. The electronic device of claim 1, further comprising a third escape groove recessed between the second side wall and the second seating surface in a diagonal direction.

13. The electronic device of claim 1, wherein the first side wall is inclined so as to cause the applied adhesive material to flow into the escape groove, and the second side wall is inclined so as to cause the applied adhesive material to flow into the escape groove.

14. The electronic device of claim 1, wherein the adhesive material has at least one sink hole formed therein.

* * * * *

UNITED STATES PATENT AND TRADEMARK OFFICE
CERTIFICATE OF CORRECTION

Page 1 of 1

PATENT NO. : 11,877,405 B2
APPLICATION NO. : 17/250212
DATED : January 16, 2024
INVENTOR(S) : Sungeun Park It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 398 days.

Signed and Sealed this
First Day of July, 2025

Coke Morgan Stewart
*Acting Director of the United States Patent and Trademark Office*